(12) United States Patent
An et al.

(10) Patent No.: US 10,541,279 B2
(45) Date of Patent: Jan. 21, 2020

(54) DISPLAY DEVICE

(71) Applicant: Samsung Display Co., Ltd., Yongin-Si, Gyeonggi-Do (KR)

(72) Inventors: Chiwook An, Hwaseong-si (KR); Doyeon Kim, Seoul (KR); Sunghyun Park, Seongnam-si (KR); Jaehyun Lee, Seoul (KR); Sung-woong Cho, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 50 days.

(21) Appl. No.: 15/660,827

(22) Filed: Jul. 26, 2017

(65) Prior Publication Data
US 2018/0033833 A1 Feb. 1, 2018

(30) Foreign Application Priority Data

Jul. 29, 2016 (KR) .................. 10-2016-0097493

(51) Int. Cl.
*G06F 3/041* (2006.01)
*H01L 27/32* (2006.01)
*G09G 3/3225* (2016.01)
*H01L 51/52* (2006.01)

(52) U.S. Cl.
CPC .......... *H01L 27/323* (2013.01); *G06F 3/0412* (2013.01); *G09G 3/3225* (2013.01); *H01L 51/5256* (2013.01); *H01L 27/3244* (2013.01)

(58) Field of Classification Search
CPC . H01L 27/323; H01L 51/5256; G06F 3/0412; G06F 3/044; G09G 3/3225
See application file for complete search history.

(56) References Cited

U.S. PATENT DOCUMENTS

| | | | |
|---|---|---|---|
| 6,504,202 B1* | 1/2003 | Allman | H01L 28/40 257/303 |
| 2010/0182273 A1* | 7/2010 | Noguchi | G02F 1/13338 345/174 |
| 2014/0320769 A1* | 10/2014 | Masuda | G06F 3/044 349/12 |
| 2015/0382446 A1* | 12/2015 | Kwon | H05K 1/028 174/251 |

(Continued)

FOREIGN PATENT DOCUMENTS

| | | |
|---|---|---|
| CN | 103676826 A | 3/2014 |
| CN | 104063039 A | 9/2014 |

(Continued)

OTHER PUBLICATIONS

EPO Extended Search Report dated Nov. 29, 2017, for corresponding European Patent Application No. 17183323.9 (10 pages).

*Primary Examiner* — Towfiq Elahi

(74) *Attorney, Agent, or Firm* — Lewis Roca Rothgerber Christie LLP

(57) ABSTRACT

A display device includes a display panel, and a touch sensing unit on the display panel, the touch sensing unit including a first conductive pattern on the display panel, an insulating layer covering the first conductive pattern, and a second conductive pattern on the insulating layer, partially crossing the first conductive pattern, and having a thickness that is greater than a thickness of the first conductive pattern.

19 Claims, 32 Drawing Sheets

(56) References Cited

U.S. PATENT DOCUMENTS

| | | | |
|---|---|---|---|
| 2016/0041644 A1* | 2/2016 | Bae | G06F 3/044 345/174 |
| 2016/0103549 A1* | 4/2016 | Lee | H01L 27/323 345/173 |
| 2016/0147335 A1 | 5/2016 | Nishizawa et al. | |
| 2016/0162060 A1 | 6/2016 | Hong et al. | |
| 2017/0336907 A1 | 11/2017 | Jeong et al. | |

FOREIGN PATENT DOCUMENTS

| | | |
|---|---|---|
| CN | 105282333 A | 1/2016 |
| KR | 10-2014-0133401 | 11/2014 |
| KR | 10-2015-0022215 | 3/2015 |
| KR | 10-2016-0017830 | 2/2016 |
| KR | 10-2016-0043211 | 4/2016 |
| KR | 10-2016-0079280 | 7/2016 |
| WO | WO 2014/058116 A1 | 4/2014 |
| WO | WO 2014/168203 A1 | 10/2014 |

\* cited by examiner

DISPLAY DEVICE

CROSS-REFERENCE TO RELATED APPLICATION

This patent application claims priority to, and the benefit of, Korean Patent Application No. 10-2016-0097493, filed on Jul. 29, 2016, the content of which is hereby incorporated by reference in its entirety.

BACKGROUND

1. Field

The present disclosure relates to a display device capable of preventing a crack in an insulating layer included in a touch sensing unit.

2. Description of the Related Art

In an information society, the importance of a display device is further highlighted as a visual information transmission medium. As the display device, a liquid crystal display (LCD), a plasma display panel (PDP), an organic light emitting display (OLED), a field effect display (FED), and an electrophoretic display (EPD) are widely used.

The display device operates by receiving an electrical signal from an external source, and may include a touch screen to sense a touch event occurring on a display panel displaying an image.

The display device includes various electrode patterns activated by the electrical signal. Areas in which the electrode patterns are activated display information or respond to the touch event.

SUMMARY

The present disclosure provides a display device capable of preventing occurrence of a crack in an insulating layer included in a touch sensing unit.

The present disclosure also provides a display device capable of preventing the touch sensing unit from shorting.

Embodiments of the present disclosure provide a display device including a display panel, and a touch sensing unit on the display panel, the touch sensing unit including a first conductive pattern on the display panel, an insulating layer covering the first conductive pattern, and a second conductive pattern on the insulating layer, partially crossing the first conductive pattern, and having a thickness that is greater than a thickness of the first conductive pattern.

The first conductive pattern and the insulating layer may be directly on a thin film encapsulation layer of the display panel, and the insulating layer may include a first part on the first conductive pattern, and spaced from the thin film encapsulation layer, a second part contacting with the thin film encapsulation layer, and a third part connecting the first part and the second part.

The thickness of the first conductive pattern may be less than a thickness of the insulating layer.

The thickness of the first conductive pattern may be equal to or greater than about 1800 angstroms, and equal to or less than about 2100 angstroms, and the thickness of the second conductive pattern may be equal to or greater than about 2700 angstroms, and equal to or less than about 3500 angstroms.

The first conductive pattern may include a first conductive layer on the display panel, a second conductive layer on the first conductive layer, and a third conductive layer on the second conductive layer, the second conductive layer having an electrical resistivity that is less than an electrical resistivity of the first and third conductive layers, and having a thickness that is greater than a thickness of the first conductive layer and a thickness of the third conductive layer.

The thickness of the third conductive layer may be greater than the thickness of the first conductive layer.

The thickness of the third conductive layer may be within a range from about one and a half times to about three times the thickness of the first conductive layer.

The thickness of the first conductive layer may be in a range from about 50 angstroms to about 200 angstroms, the thickness of the second conductive layer may be in a range from about 1000 angstroms to about 1800 angstroms, and the thickness of the third conductive layer may be in a range from about 250 angstroms to about 350 angstroms.

Each of the first conductive layer and the third conductive layer may include titanium (Ti), and the second conductive layer may include aluminum (Al).

The second conductive pattern may include a fourth conductive layer on the insulating layer, a fifth conductive layer on the fourth conductive layer, and a sixth conductive layer on the fifth conductive layer, the fifth conductive layer having an electrical resistivity that is less than an electrical resistivity of the fourth and sixth conductive layers, and having a thickness that is greater than a thickness of the fourth conductive layer and a thickness of the sixth conductive layer.

The thickness of the second conductive layer may be less than the thickness of the fifth conductive layer.

The thickness of the first conductive layer may be less than the thickness of the fourth conductive layer.

The thickness of the fourth conductive layer may be in a range from about 250 angstroms to about 350 angstroms, the thickness of the fifth conductive layer may be in a range from about 2200 angstroms to about 2800 angstroms, and the thickness of the sixth conductive layer may be in a range from about 250 angstroms to about 350 angstroms.

Each of the fourth conductive layer and the sixth conductive layer may include titanium (Ti), and the fifth conductive layer may include aluminum (Al).

The second conductive pattern may include first connection parts, first touch sensor parts connected to each other by the first connection parts, and second touch sensor parts spaced from the first touch sensor parts.

The first conductive pattern may include second connection parts connecting the second touch sensor parts, and crossing the first connection parts.

The first conductive pattern may include second connection parts connecting the second touch sensor parts, each of the first touch sensor parts and the second touch sensor parts may include a plurality of mesh lines defining a plurality of mesh holes, and the second connection parts may cross the mesh lines of the first touch sensor parts and the mesh lines of the second touch sensor parts.

The second connection parts might not cross the first connection parts.

The first conductive pattern may include second connection parts connecting the second touch sensor parts, the insulating layer may be provided with a contact hole defined therethrough, and the second connection parts may connect the second touch sensor parts through the contact hole.

The display panel may include a base layer, a circuit layer on the base layer, an organic light emitting device layer on the circuit layer, and a thin film encapsulation layer on the organic light emitting device layer.

According to the above, the occurrence of cracking of the insulating layer included in the touch sensing unit may be reduced, and consequently, the short defect of the touch sensing unit may be avoided.

BRIEF DESCRIPTION OF THE DRAWINGS

The above and other aspects of the present disclosure will become readily apparent by reference to the following detailed description when considered in conjunction with the accompanying drawings, wherein.

DETAILED DESCRIPTION

Figure 1A:
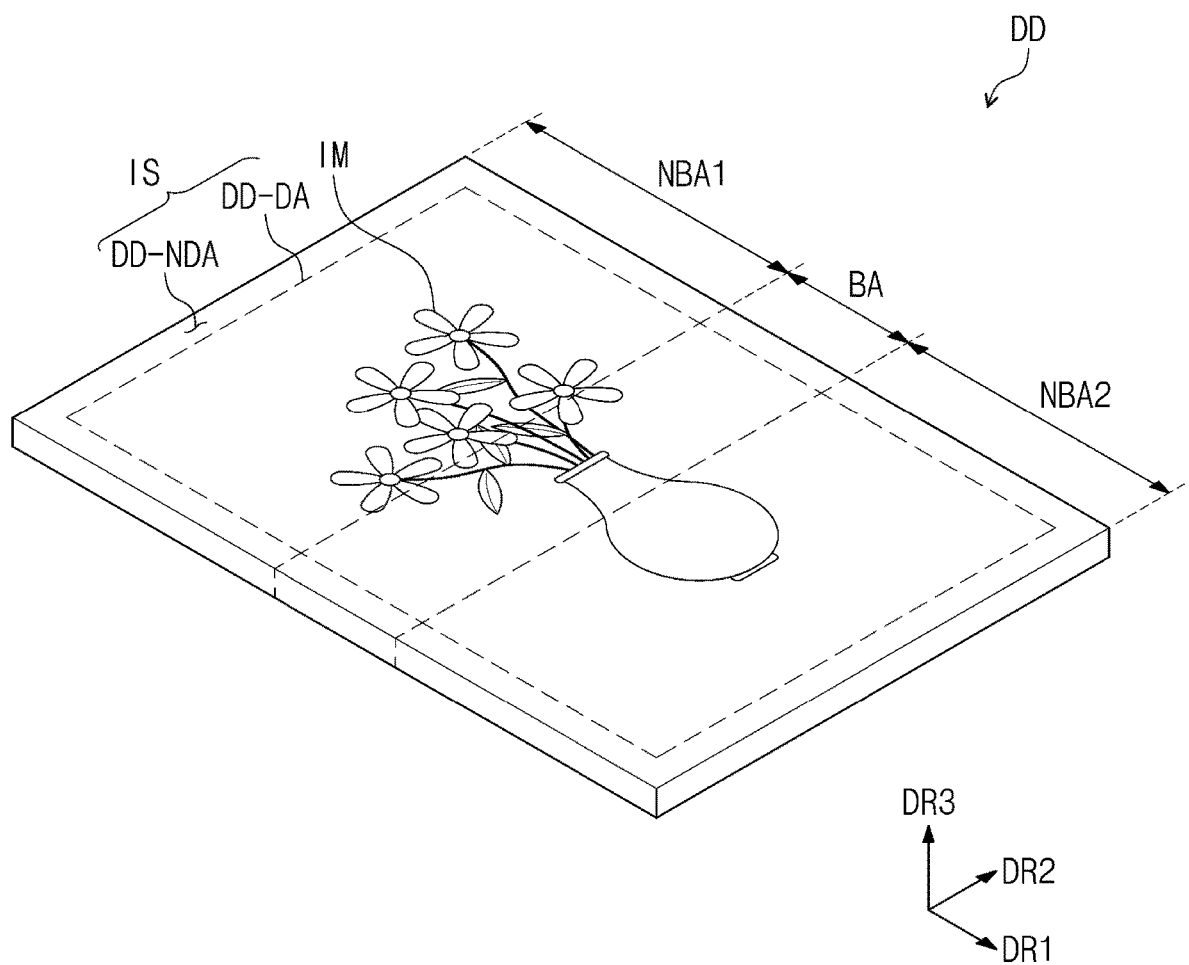
FIG. 1A is a perspective view showing a display device in a first operation state according to an embodiment of the present disclosure.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, the present invention will be explained in detail with reference to the accompanying drawings.

Figure 1B:
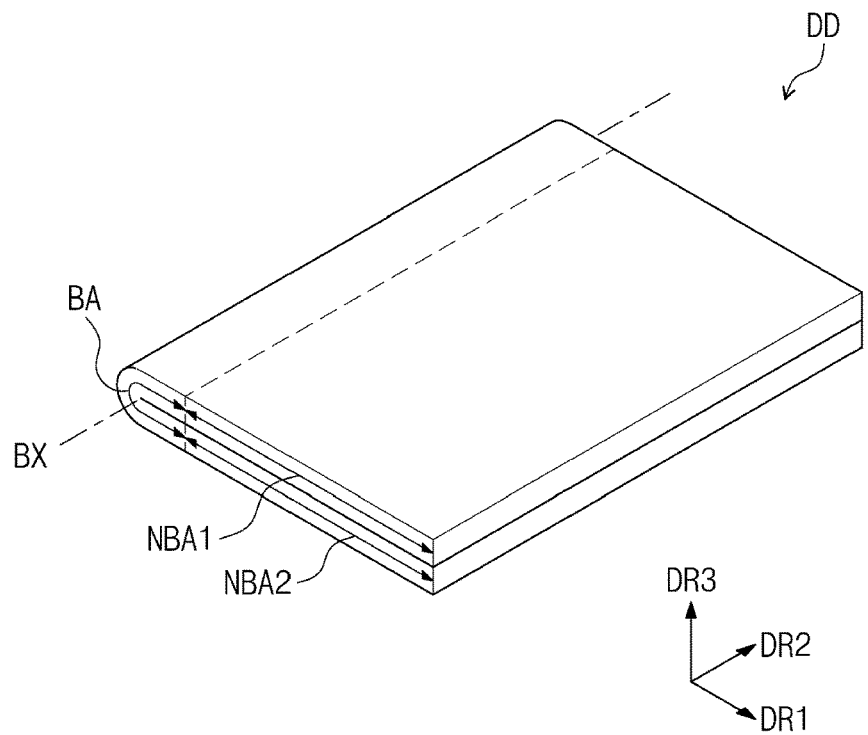
FIG. 1B is a perspective view showing a display device in a second operation state according to an embodiment of the present disclosure.
Figure 1C:
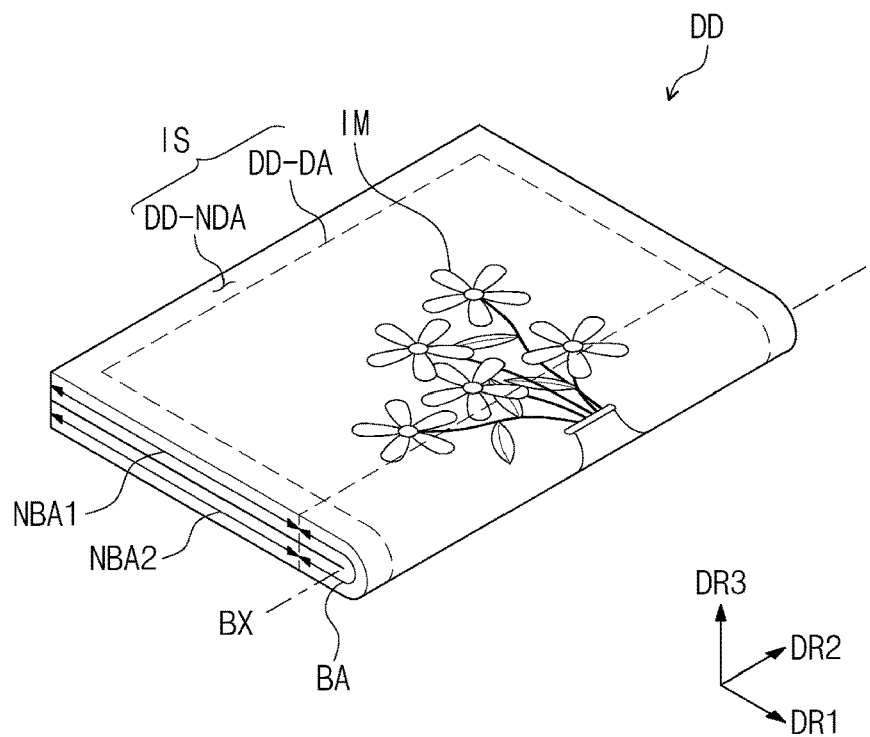
FIG. 1C is a perspective view showing a display device in a third operation state according to an embodiment of the present disclosure.

FIG. 1A is a perspective view showing a display device DD in a first operation state according to an embodiment of the present disclosure. FIG. 1B is a perspective view showing the display device DD in a second operation state according to an embodiment of the present disclosure. FIG. 1C is a perspective view showing the display device DD in a third operation state according to an embodiment of the present disclosure.

Referring to FIG. 1A, a display surface IS, in which an image IM is displayed in a first operation state of the display device DD, is substantially parallel to a surface or plane defined by a first direction axis DR1 and a second direction axis DR2. A direction that is normal to the display surface IS (i.e., a thickness direction of the display device DD), indicates a third direction DR3. A front surface (or an "upper surface") is distinguished from a rear surface (or a "lower surface") by the third direction axis DR3. However, the first to third direction axes DR1 to DR3 are relative terms to each other, and thus the first to third direction axes DR1 to DR3 may be changed to any other directions. Hereinafter, first to third directions correspond to directions respectively indicated by the first to third direction axes DR1 to DR3, and thus the first to third directions are assigned with the same reference numerals as those of the first to third direction axes DR1 to DR3.

FIGS. 1A to 1C show a foldable display device as a representative example of the flexible display device DD, but it should not be limited there to or thereby. For example, the flexible display device DD may be a rollable display device, a bendable display device, or a flat rigid display device, for example. The flexible display device DD according to the present embodiment may be applied to a large-sized electronic item, such as a television set, a monitor, etc., and may be applied to a small and medium-sized electronic item, such as a mobile phone, a tablet, a car navigation unit, a game unit, a smart watch, etc.

Referring to FIG. 1A, the display surface IS of the flexible display device DD may include a plurality of areas. The flexible display device DD includes a display area DD-DA in which the image IM is displayed, and a non-display area DD-NDA located next to the display area DD-DA. The image IM is not displayed in the non-display area DD-NDA. FIG. 1A shows an image of a vase as the image IM. As an example, the display area DD-DA has a substantially quadrangular shape, and the non-display area DD-NDA surrounds the display area DD-DA, but they should not be limited thereto or thereby. That is, the shape of the display area DD-DA and the shape of the non-display area DD-NDA may be designed relative to each other.

Referring to FIGS. 1A to 1C, the display device DD is divided into a plurality of areas in accordance with the operation state thereof. The display device DD includes a bending area BA that may be bent with respect to a bending axis BX, a first non-bending area NBA1 that is not bent, and a second non-bending area NBA2 that is not bent. As shown in FIG. 1B, the display device DD may be inwardly bent such that the display surface IS of the first non-bending area NBA1 faces the display surface IS of the second non-bending area NBA2. As shown in FIG. 1C, the display device DD may be outwardly bent to allow the display surface IS to be exposed.

FIGS. 1A to 1C show only one bending area BA, but the number of the bending area BA is not limited to one. For instance, in the present embodiment, the display device DD may include a plurality of bending areas BA. In some embodiments, the display device DD may be configured to repeatedly perform only the operation modes shown in FIGS. 1A and 1B, although the present invention is not limited thereto or thereby. That is, the bending area BA may be defined to correspond to the user's operation performed on the display device DD. For instance, different from FIGS. 1B and 1C, the bending area BA may be defined to be substantially parallel to the first direction axis DR1 or may be defined in a diagonal direction. The bending area BA may have an area determined depending on a radius of curvature while not being fixed.

Figure 2:
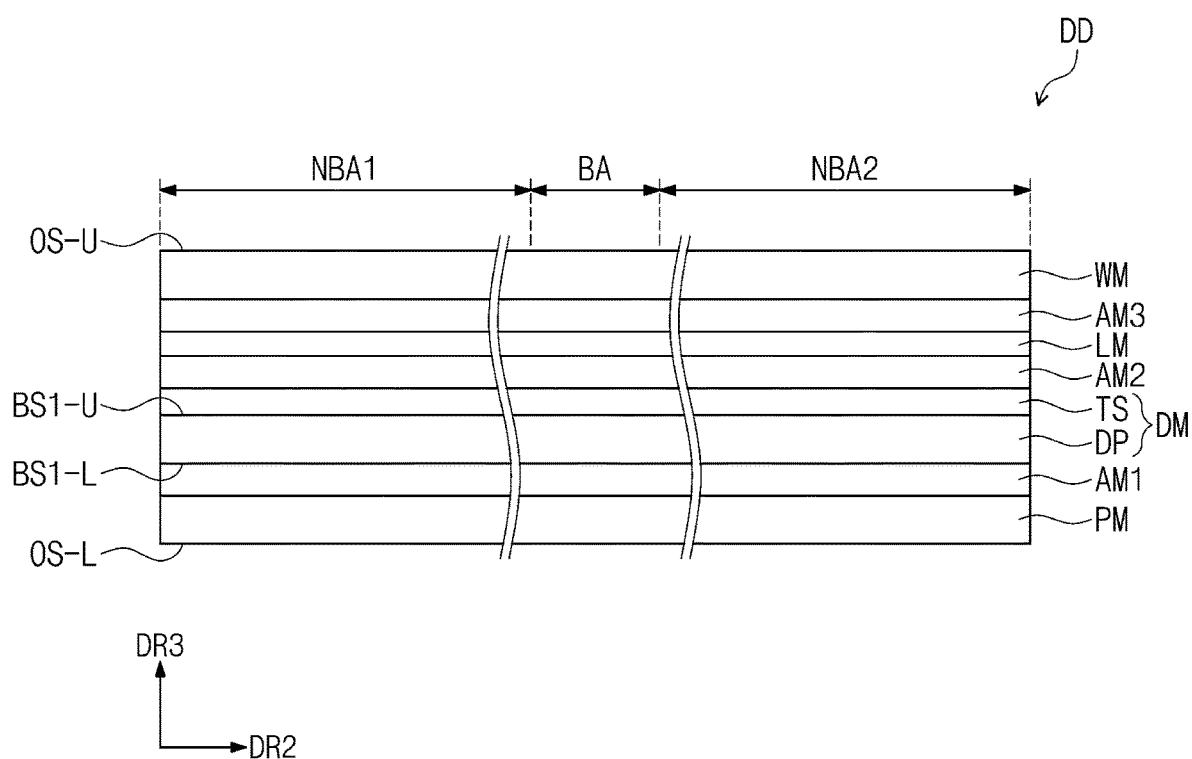
FIG. 2 is a cross-sectional view showing a display device according to an embodiment of the present disclosure.

FIG. 2 is a cross-sectional view showing a display device DD according to an embodiment of the present disclosure. FIG. 2 shows the cross-section defined by the second and third directions DR2 and DR3.

Referring to FIG. 2, the display device DD includes a protective film PM, a display module DM, an optical member LM, a window WM, a first adhesive member AM1, a second adhesive member AM2, and a third adhesive member AM3. The display module DM is located between the protective film PM and the optical member LM. The optical member LM is located between the display module DM and the window WM. The first adhesive member AM1 couples the display module DM and the protective film PM. The second adhesive member AM2 couples the display module DM and the optical member LM. The third adhesive member AM3 couples the optical member LM and the window WM. If suitable, at least one of the first, second, and third adhesive members AM1, AM2, and AM3 may be omitted.

The protective film PM protects the display module DM. The protective film PM includes a first outer surface OS-L exposed to the outside and an adhesive surface adhered to the first adhesive member AM1. The protective film PM prevents external moisture from entering the display module DM and absorbs external impacts.

The protective film PM may include a plastic film as a base substrate. The plastic film may include one or more of polyethersulfone (PES), polyacrylate, polyetherimide (PEI), polyethylenenaphthalate (PEN), polyethyleneterephthalate (PET), polyphenylene sulfide (PPS), polyarylate, polyimide (PI), polycarbonate (PC), poly(arylene ethersulfone), and a mixture thereof.

The material of the protective film PM may include a mixed material of an organic material and an inorganic material without being limited to plastic resins. The protective film PM may include a porous organic layer and an inorganic material filled in pores of the organic layer. The protective film PM may further include a functional layer formed in the plastic film. The functional layer may include a resin layer, and may be formed by a coating method. In other embodiments, the protective film PM may be omitted.

The window WM protects the display module DM from the external impacts and provides an input surface to the user. The window WM provides a second outer surface OS-U exposed to the outside, and an adhesive surface adhered to the third adhesive member AM3. The display surface IS shown in FIGS. 1A to 1C may be the second outer surface OS-U.

The window WM may include a plastic film. The window WM may have a multi-layer structure, which may be of a glass substrate, a plastic film, or a plastic substrate. The window WM may further include a bezel pattern. The multi-layer structure of the window WM may be formed through consecutive processes or an adhesive process using an adhesive.

The optical member LM reduces a reflectance of an external light. The optical member LM may include at least a polarizing film, and may further include a retardation film. In other embodiments, the optical member LM may be omitted.

The display module DM includes a display panel DP and a touch sensing unit TS. The touch sensing unit TS is directly located on the display panel DP. In the following descriptions, the expression "a first component is directly located on a second component" means that the first and second components are formed through consecutive processes without being attached to each other by using a separate adhesive layer. According to other embodiments, other layers (e.g., an adhesive layer, a substrate, etc.) may be interposed between the display panel DP and the touch sensing unit TS.

Hereinafter, an organic light emitting display panel DP will be described as the display panel DP, but the display panel DP should not be limited to the organic light emitting display panel DP. The display panel DP may be a liquid crystal display panel, a plasma display panel, an electrophoretic display panel, a microelectromechanical system (MEMS) display panel, or an electrowetting display panel.

The organic light emitting display panel DP generates the image IM (refer to FIG. 1) corresponding to image data input thereto. The organic light emitting display panel DP includes a first display panel surface BS1-L, and a second display panel surface BS1-U facing the first display panel surface BS1-L in the thickness direction DR3.

The touch sensing unit TS obtains coordinate information of an external input. The touch sensing unit TS senses the external input in an electrostatic capacitive manner.

The display module DM according to other embodiments may further include an anti-reflection layer. The anti-reflection layer may include a stack structure of a color filter or a conductive layer/an insulating layer/a conductive layer. The anti-reflection layer absorbs or polarizes external light to reduce reflectance of the external light. The anti-reflection layer may be used to substitute the function of the optical member LM.

Each of the first, second, and third adhesive members AM1, AM2, and AM3 may be, but are not limited to, an organic adhesive layer, such as an optically clear adhesive film (OCA), an optically clear resin (OCR), or a pressure sensitive adhesive film (PSA). The organic adhesive layer may include, for example, a polyurethane-based adhesive material, a polyacryl-based adhesive material, a polyester-based adhesive material, a poly epoxy-based adhesive material, or a polyvinyl acetate-based adhesive material.

The display device DD may further include a frame structure for supporting the functional layers to maintain the states shown in FIGS. 1A, 1B, and 1C. The frame structure may have a joint structure or a hinge structure.

Figure 3A:
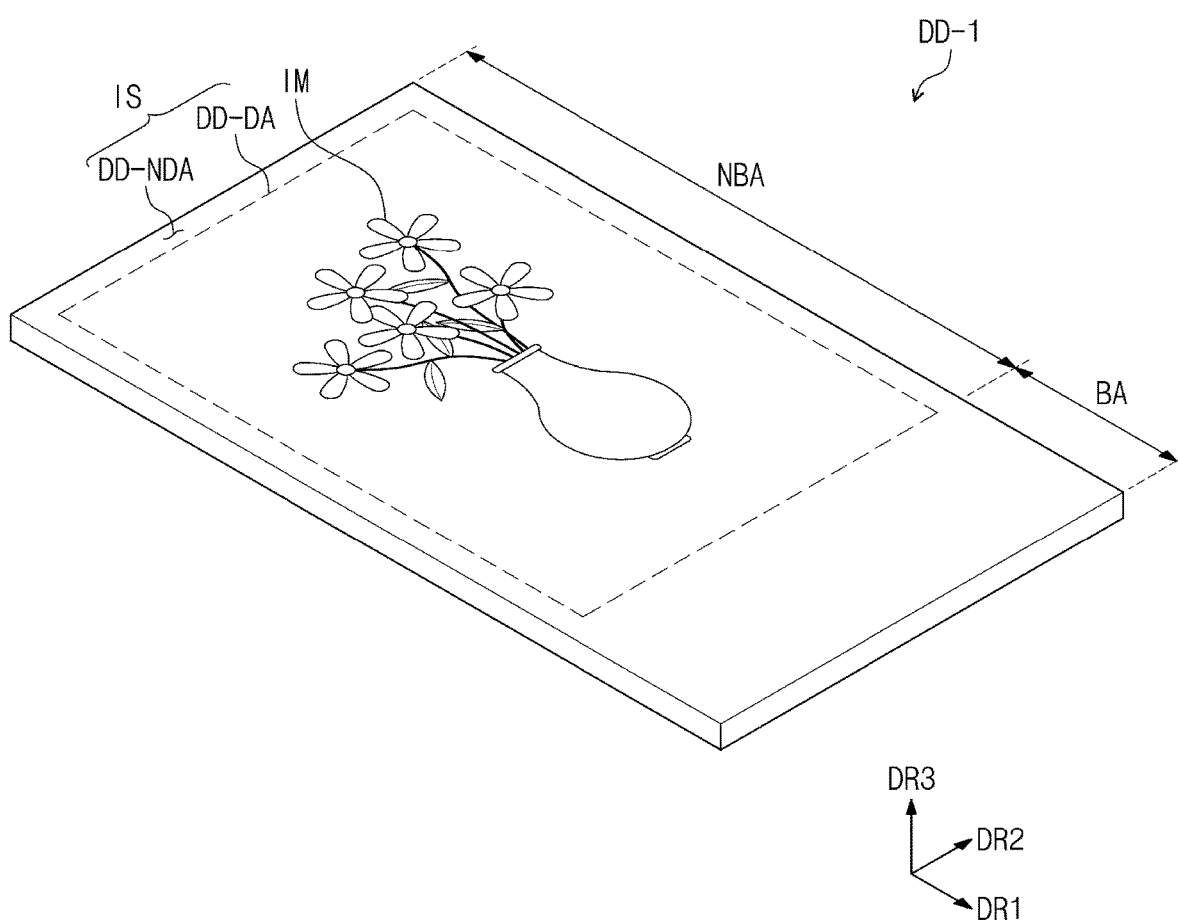
FIGS. 3A and 3B are perspective views showing a display device according to an embodiment of the present disclosure.
Figure 3B:
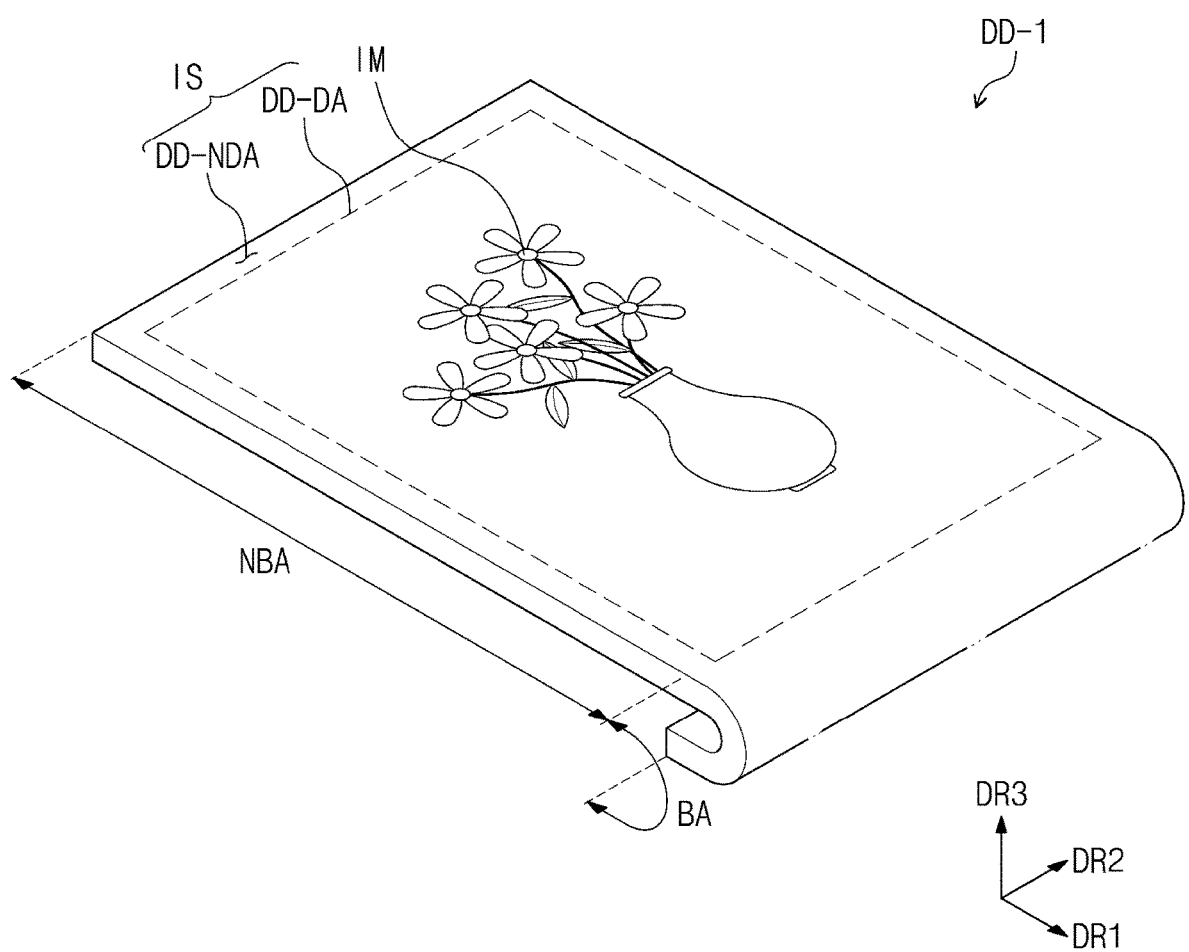

FIGS. 3A and 3B are perspective views showing a display device DD-1 according to an embodiment of the present disclosure. FIG. 3A shows the display device DD-1 in an unfolded state, and FIG. 3B shows the display device DD-1 in a bent state.

The display device DD-1 includes one bending area BA and one non-bending area NBA. The non-display area DD-NDA of the display device DD-1 is bent, however, the bending area of the display device DD-1 may be changed in other embodiments.

Different from the display device DD shown in FIGS. 1A to 1C, the display device DD-1 may be fixed in one state while being operated. The display device DD-1 may be operated in the bent state as shown in FIG. 3B. The display device DD-1 may be fixed to a frame while being bent, and the frame may be coupled to a housing of an electronic device.

The display device DD-1 according to the present embodiment may have substantially the same cross-sectional structure as that shown in FIG. 2. However, the non-bending area NBA and the bending area BA may have different stack structures from each other. The non-bending area NBA may have substantially the same cross-sectional structure as that shown in FIG. 2, and the bending area BA may have a cross-sectional structure different from that shown in FIG. 2. For example, the optical member LM and the window WM may be omitted from the bending area BA. That is, the optical member LM and the window WM may be located only in the non-bending area NBA. The second and third adhesive members AM2 and AM3 may be omitted from the bending area BA.

Figure 4A:
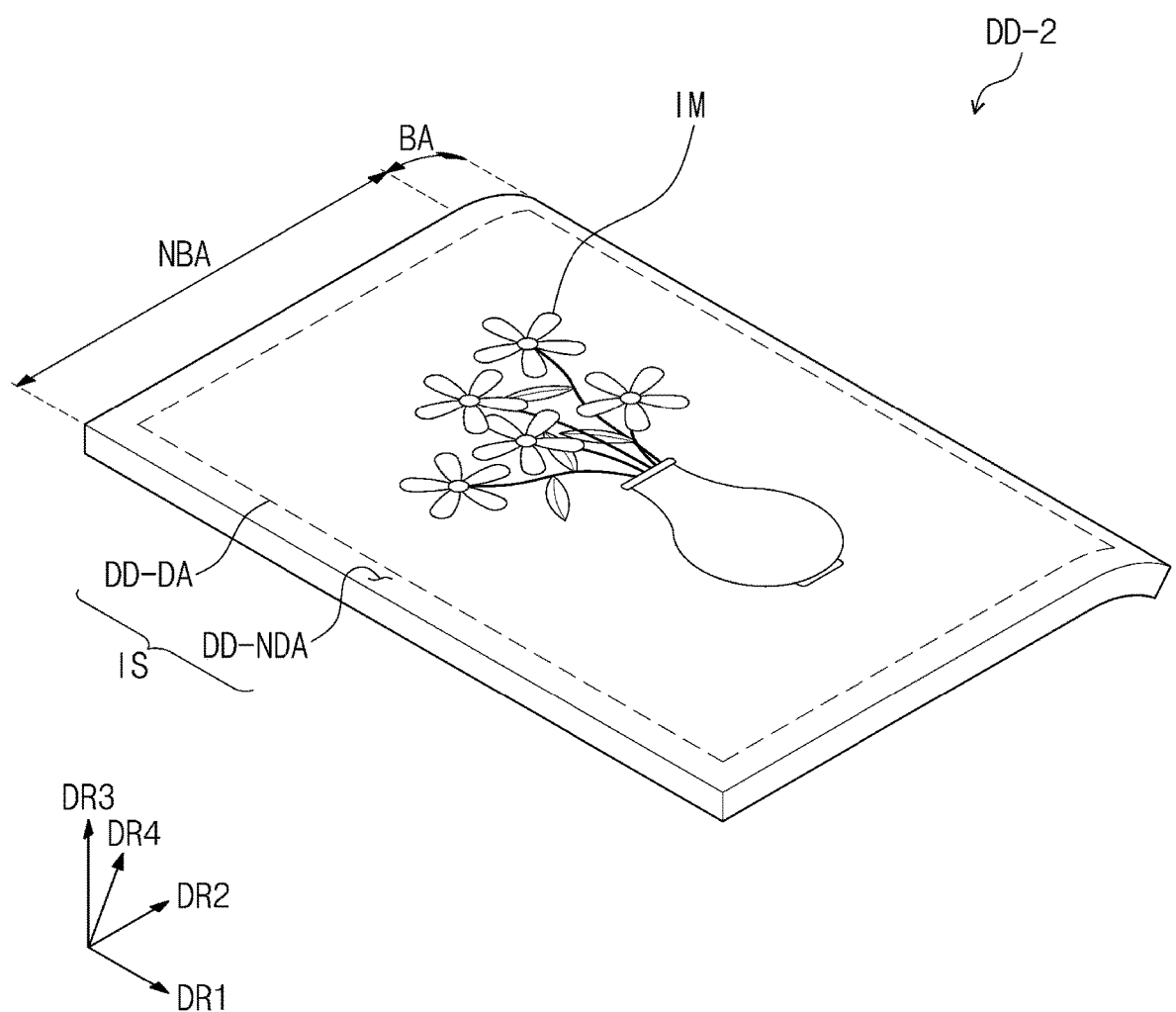
FIGS. 4A and 4B are perspective views showing a display device according to an embodiment of the present disclosure.

FIG. 4A is a perspective view showing a display device DD-2 according to an embodiment of the present disclosure.

Referring to FIG. 4A, the display device DD-2 includes a non-bending area (or a "plan surface area") NBA in which a main image is displayed to a front direction, and a bending area (or a "side surface area") BA in which a sub-image is displayed to a side direction. The sub-image may include an icon for providing information. In the present embodiment, the terms of "non-bending area NBA and bending area BA" used herein define the display device DD-2 configured to include plural areas with different shapes from each other.

The bending area BA bent from the non-bending area NBA displays the sub-image to a fourth direction axis DR4 crossing the first direction axis DR1, the second direction axis DR2, and the third direction axis DR3. However, the first to fourth direction axes DR1 to DR4 are relative terms to each other, and thus the first to fourth direction axes DR1 to DR4 may be changed to any other directions.

Figure 4B:
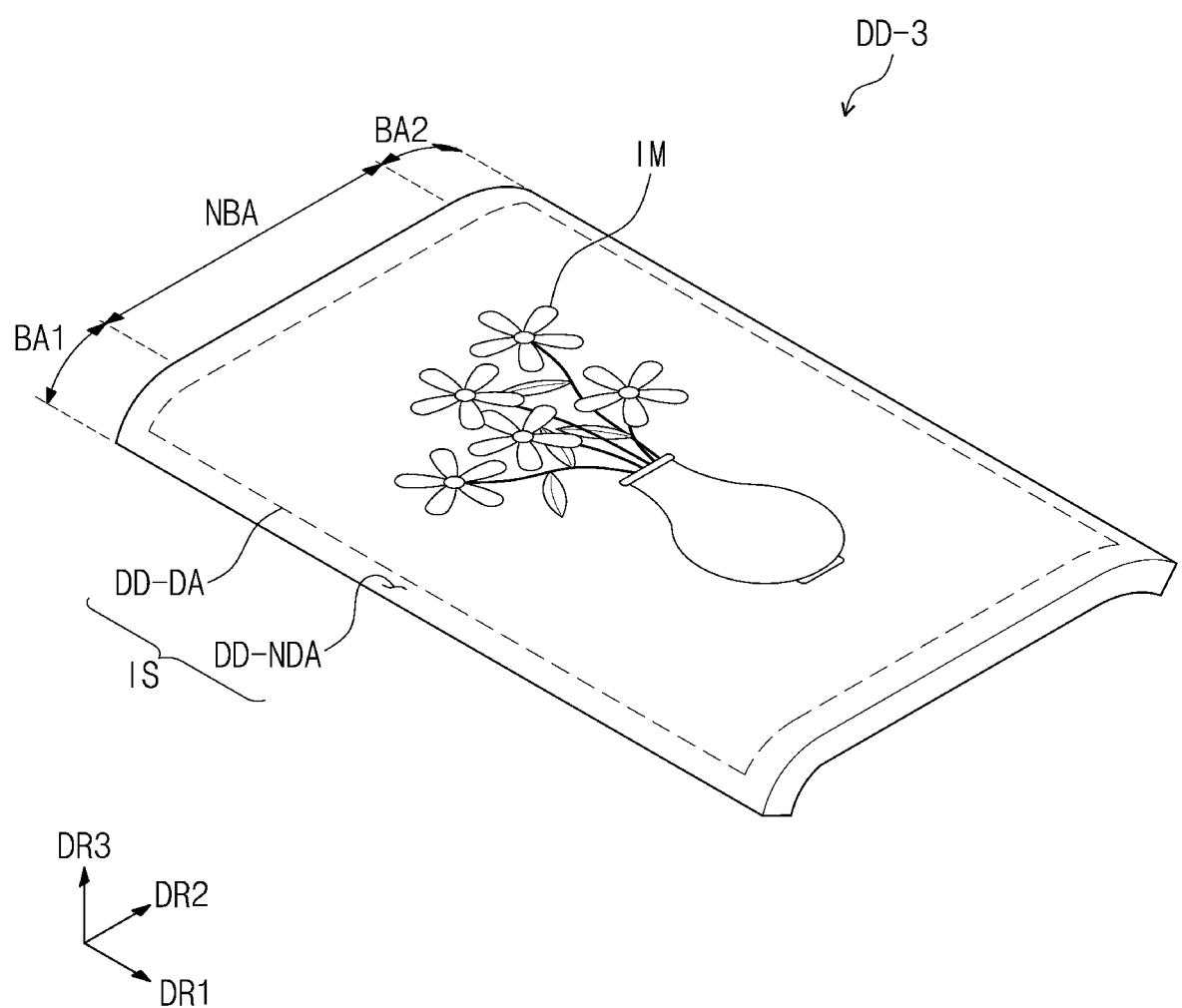

FIG. 4B is a perspective view showing a display device DD-3 according to an embodiment of the present disclosure.

Referring to FIG. 4B, the display device DD-3 includes a non-bending area NBA in which a main image is displayed to a front direction, and includes first and second bending areas BA1 and BA2 in which a sub-image is displayed to a side direction. The first bending area BA1 and the second bending area BA2 are respectively bent from opposite sides of the non-bending area NBA.

Figure 5A:
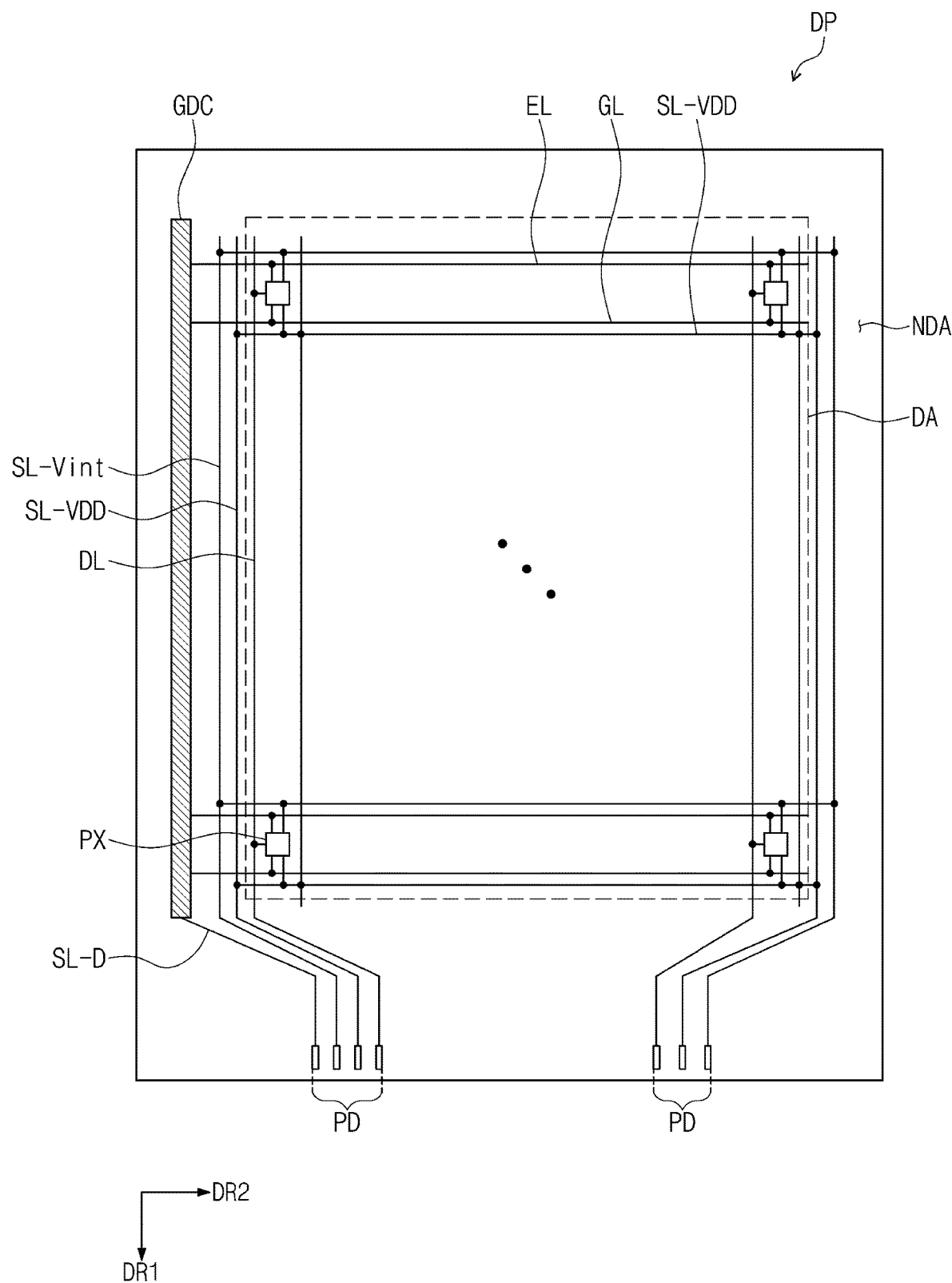
FIG. 5A is a plan view showing a display panel included in a display device according to an embodiment of the present disclosure.
Figure 5B:
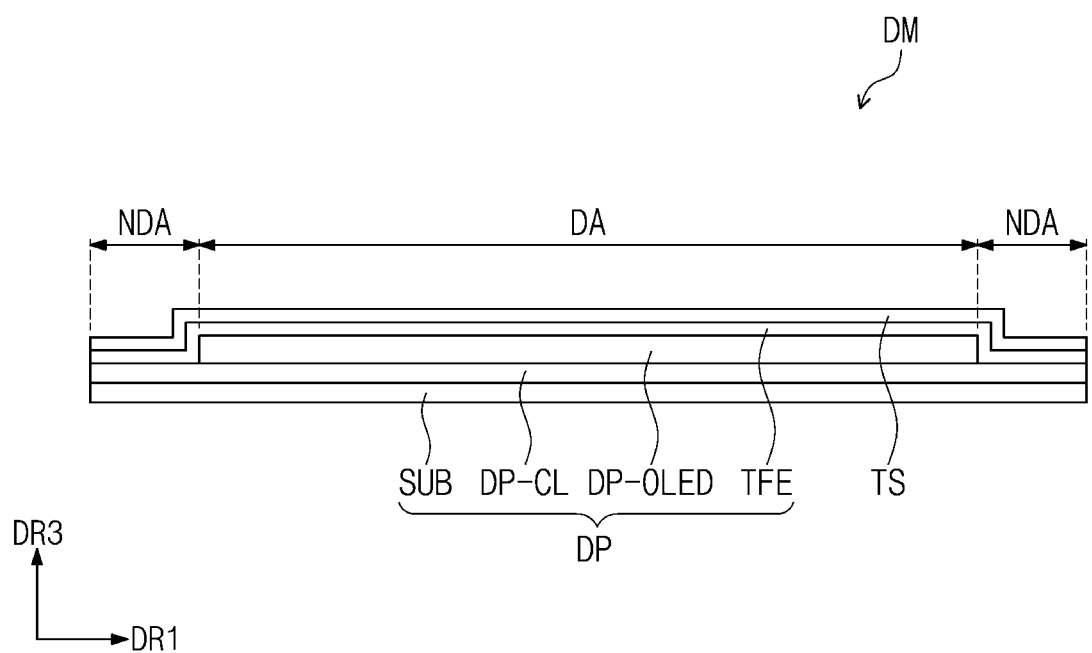
FIG. 5B is a cross-sectional view showing a display module included in a display device according to an embodiment of the present disclosure.

FIG. 5A is a plan view showing an organic light emitting display panel DP included in a display device according to an embodiment of the present disclosure, and FIG. 5B is a cross-sectional view showing a display module DM included in a display device according to an embodiment of the present disclosure.

Referring to FIG. 5A, the organic light emitting display panel DP includes a display area DA and a non-display area NDA when viewed in a plan view. The display area DA and the non-display area NDA of the organic light emitting display panel DP respectively correspond to the display area DD-DA and the non-display area DD-NDA of the display device DD (refer to FIG. 1A). The display area DA and the non-display area NDA of the organic light emitting display panel DP are not required to be identical to the display area DD-DA and the non-display area DD-NDA of the display device DD of FIG. 1A, and the display area DA and the non-display area NDA of the organic light emitting display panel DP may be changed in accordance with the structure and design of the organic light emitting display panel DP.

The organic light emitting display panel DP includes a plurality of pixels PX. An area in which the pixels PX are arranged is referred to as the display area DA. In the present embodiment, the non-display area NDA is defined along an edge of the display area DA.

The organic light emitting display panel DP includes gate lines GL, data lines DL, light emitting lines EL, a control signal line SL-D, an initialization voltage line SL-Vint, a voltage line SL-VDD, and a pad part PD.

Each of the gate lines GL is connected to corresponding pixels of the pixels PX, and each of the data lines DL is connected to corresponding pixels of the pixels PX. Each of the light emitting lines EL is arranged to be substantially parallel to a corresponding gate line of the gate lines GL. The control signal line SL-D applies a control signal to a gate driving circuit GDC. The initialization voltage line SL-Vint applies an initialization voltage to the pixels PX. The voltage line SL-VDD is connected to the pixels PX to apply a first voltage to the pixels PX. The voltage lines SL-VDD includes a plurality of lines extending in the first direction DR1, and a plurality of lines extending in the second direction DR2.

The gate driving circuit GDC is located at one side portion of the non-display area NDA, and is connected to the gate lines GL and the light emitting lines EL. Some of the gate lines GL, the data lines DL, the light emitting lines EL, the control signal line SL-D, the initialization voltage line SL-Vint, and the voltage line SL-VDD are located on the same layer, and the others of the gate lines GL, the data lines DL, the light emitting lines EL, the control signal line SL-D, the initialization voltage line SL-Vint, and the voltage line SL-VDD are located on different layers.

The pad part PD is connected to an end of the data lines DL, the control signal line SL-D, the initialization voltage line SL-Vint, and the voltage line SL-VDD. As shown in FIG. 5B, the organic light emitting display panel DP includes a base layer/base substrate SUB, a circuit layer DP-CL located on the base layer SUB, an organic light emitting device layer DP-OLED located on the circuit layer DP-CL, and a thin film encapsulation layer TFE located on the organic light emitting device layer DP-OLED.

The base layer SUB includes at least one plastic film. The base layer SUB may be a flexible substrate, and may include a plastic substrate, a glass substrate, a metal substrate, or an organic/inorganic-mixed material substrate. The plastic substrate includes at least one of an acryl-based resin, a methacryl-based resin, polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

The circuit layer DP-CL includes a plurality of insulating layers, a plurality of conductive layers, and a semiconductor layer. The conductive layers of the circuit layer DP-CL may form signal lines or a control circuit of the pixel.

The organic light emitting device layer DP-OLED may include organic light emitting diodes.

The thin film encapsulation layer TFE encapsulates the organic light emitting device layer DP-OLED. The thin film encapsulation layer TFE includes an inorganic layer and an organic layer. The thin film encapsulation layer TFE may include at least two inorganic layers and an organic layer located between them. The inorganic layers protect the organic light emitting device layer DP-OLED from moisture and oxygen, and the organic layer protects the organic light emitting device layer DP-OLED from foreign substance such as dust. The inorganic layer may include, for example, at least one of a silicon nitride layer, a silicon oxynitride layer, and a silicon oxide layer. The organic layer may include an acryl-based organic material, but it should not be limited thereto or thereby. According to the present embodiment, the touch sensing unit TS may provide a uniform sensitivity by adjusting a thickness of the organic layer.

The touch sensing unit TS is directly located on the thin film encapsulation layer TFE, but is not limited thereto or thereby. An inorganic layer may be located on the thin film encapsulation layer TFE, and the touch sensing unit TS may be located on the inorganic layer. The inorganic layer may be a buffer layer. The inorganic layer may include at least one of a silicon nitride layer, a silicon oxy-nitride layer, and a silicon oxide layer, but the inorganic layer should not be limited thereto or thereby. In addition, the inorganic layer may be included in the thin film encapsulation layer TFE without being provided as a separate element.

The touch sensing unit TS includes touch sensors and touch signal lines. The sensors and the touch signal lines may have a single-layer structure or a multi-layer structure.

The touch sensors and the touch signal lines may include indium tin oxide (ITO), indium zinc oxide (IZO), zinc oxide (ZnO), indium tin zinc oxide (ITZO), PEDOT, a metal nano-wire, and a graphene. The touch sensors and the touch signal lines may include a metal layer such as, for example, molybdenum, silver, titanium, copper, aluminum, or an alloy thereof. The touch sensors and the touch signal lines may have the same layer structure or different layer structures. The touch sensor layer TS will be described in detail later.

Figure 6A:
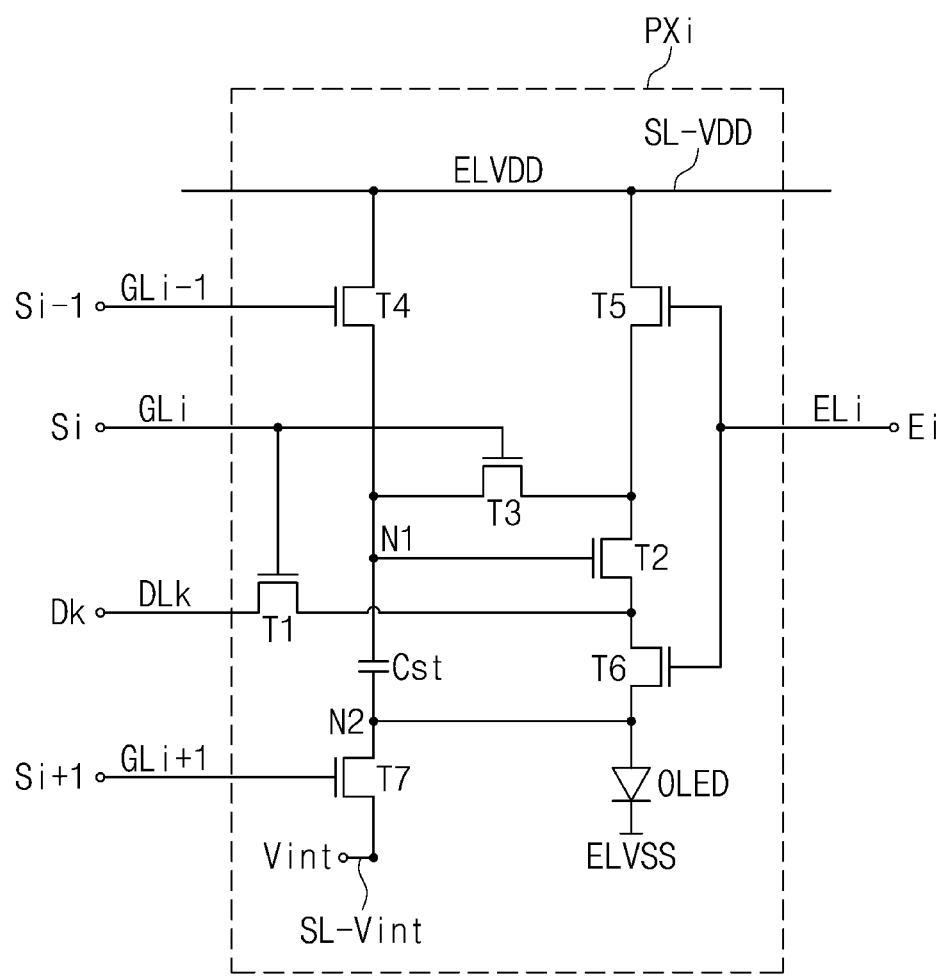
FIG. 6A is an equivalent circuit diagram of a pixel included in a display device according to an embodiment of the present disclosure.

FIG. 6A is an equivalent circuit diagram of a pixel PX included in a display device according to an embodiment of the present disclosure.

FIG. 6A shows an i-th pixel PXi connected to a k-th data line DLk among the data lines DL.

The i-th pixel PXi includes an organic light emitting diode OLED and a pixel driving circuit controlling the organic light emitting diode OLED. The pixel driving circuit includes seven thin film transistors T1 to T7 and one storage capacitor Cst. In the present embodiment, the pixel driving circuit includes seven transistors T1 to T7 and one storage capacitor Cst, but in other embodiments, the j-th pixel PXi may include only a first transistor (or a "driving transistor") T1, a second transistor (or a "switching transistor) T2, and the storage capacitor Cst as the driving circuit to drive the organic light emitting diode OLED, and the pixel driving circuit may have various configurations.

The driving transistor controls a driving current applied to the organic light emitting diode OLED. An output electrode of the second transistor T2 is electrically connected to the organic light emitting diode OLED. The output electrode of the second transistor T2 directly makes contact with an anode of the organic light emitting diode OLED or is connected to the anode of the organic light emitting diode OLED via another transistor, e.g., a sixth transistor T6.

Control electrodes of respective control transistors receive respective control signals. The control signals applied to the i-th pixel PXi include an (i−1)th gate signal Si−1, an i-th gate signal Si, an (i+1)th gate signal Si+1, a data signal Dk, and an i-th light emitting control signal Ei. In the present embodiment, the control transistors includes the first transistor T1 and third to seventh transistors T3 to T7.

The first transistor T1 includes an input electrode connected to the k-th data line DLk, a control electrode connected to an i-th gate line GLi, and an output electrode connected to the output electrode of the second transistor T2. The first transistor T1 is turned on by the gate signal Si (hereinafter, referred to as the "i-th gate signal") applied to the i-th gate line GLi to provide the data signal Dk applied to the k-th data line DLk to the storage capacitor Cst.

Figure 6B:
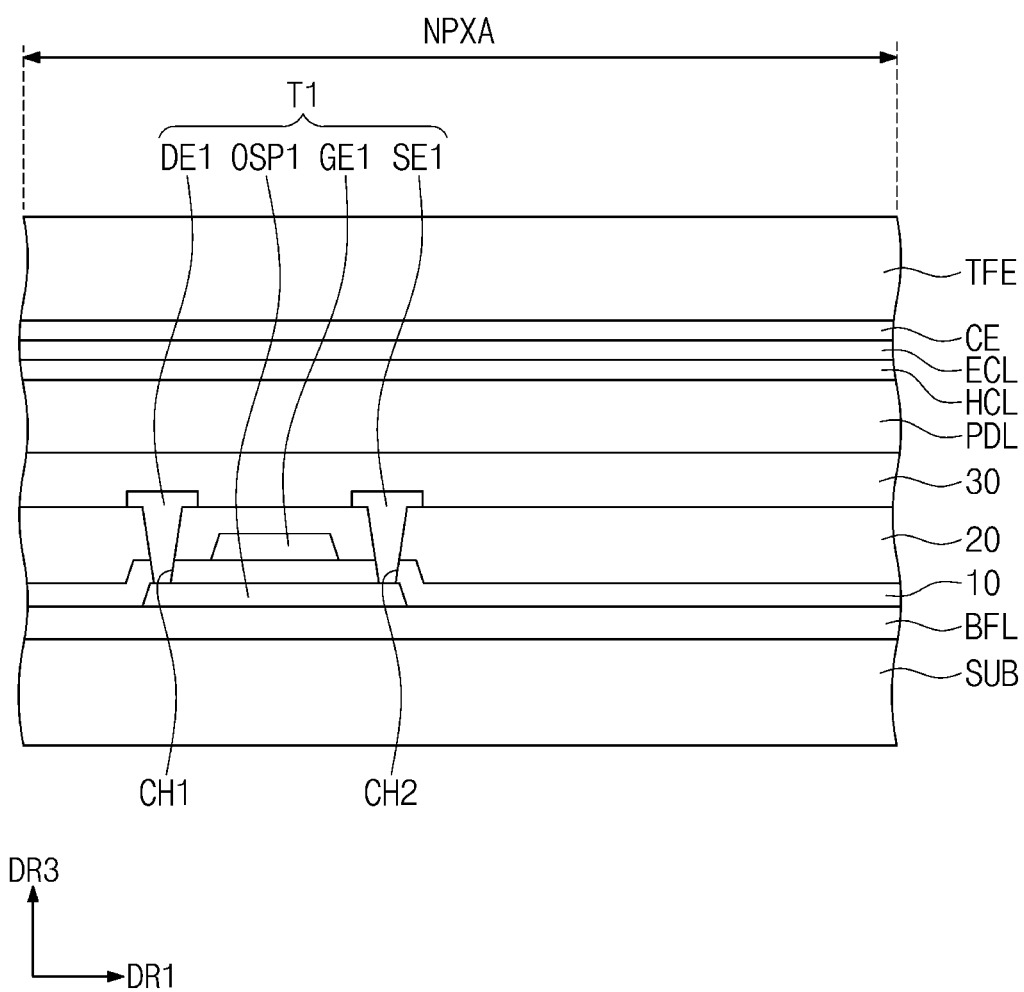
FIG. 6B is a cross-sectional view showing a portion of a display panel included in a display device according to an embodiment of the present disclosure.
Figure 6C:
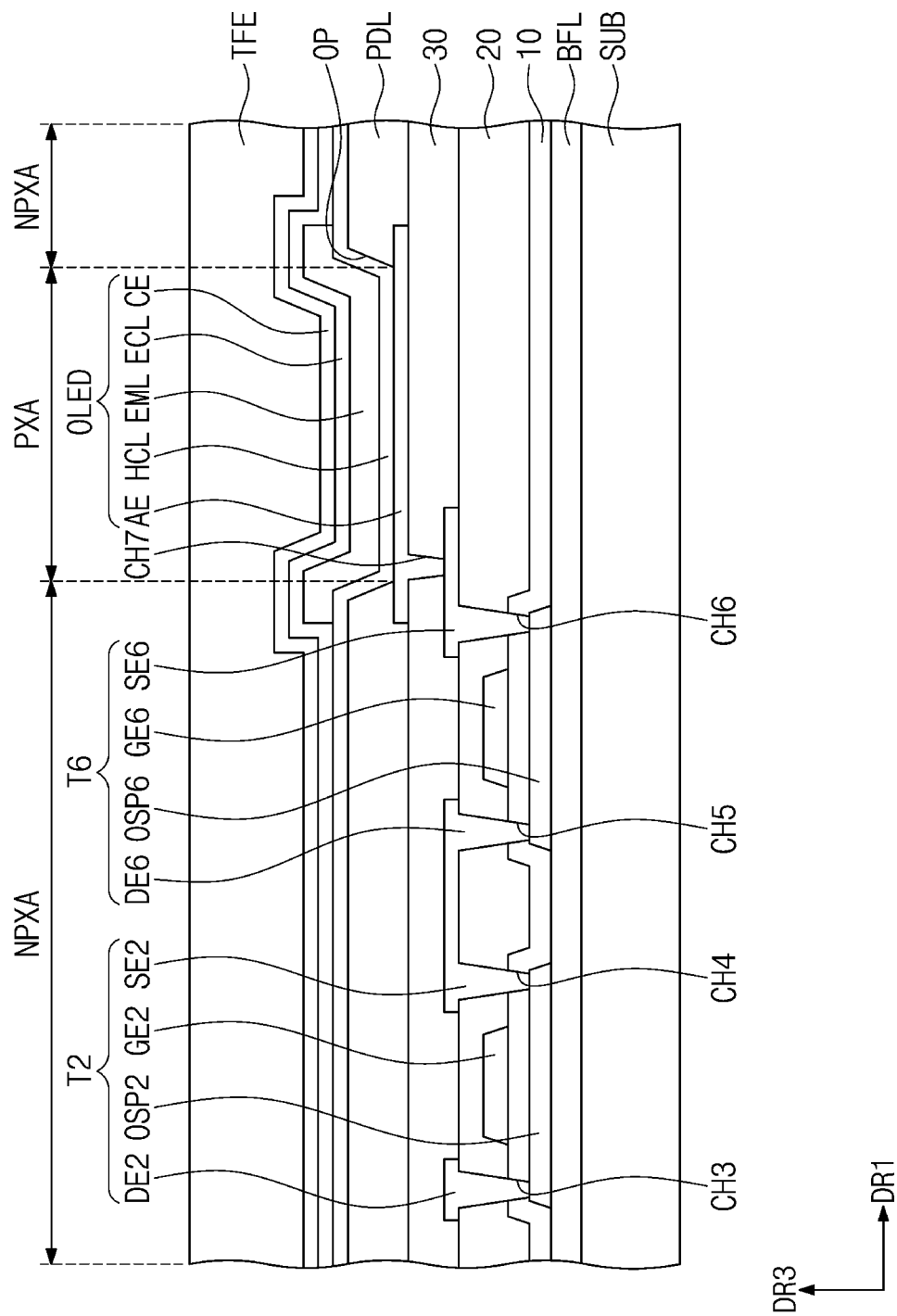
FIG. 6C is a cross-sectional view showing a portion of a display panel included in a display device according to an embodiment of the present disclosure.

FIG. 6B is a cross-sectional view showing a portion of a display panel included in a display device according to an embodiment of the present disclosure. FIG. 6C is a cross-sectional view showing a portion of a display panel included in a display device according to an embodiment of the present disclosure. In detail, FIG. 6B shows the cross-section of the portion corresponding to the first transistor T1 of the equivalent circuit shown in FIG. 6A, and FIG. 6C shows the cross-section of the portion corresponding to the second transistor T2, the sixth transistor T6, and the organic light emitting diode OLED of the equivalent circuit shown in FIG. 6A.

Referring to FIGS. 6B and 6C, the first transistor T1, the second transistor T2, and the sixth transistor T6 are located on the base layer SUB. The first, second, and sixth transistors T1, T2, and T6 have the same structure as each other, and thus the first transistor T1 will be described in detail, and repeated detail of the second and sixth transistors T2 and T6 will be omitted.

An upper surface of the base layer SUB is defined by the first direction DR1 and the second direction DR2. The first transistor T1 includes a first input electrode DE1, a first output electrode SE1, a first control electrode GE1, and a first oxide semiconductor pattern OSP1.

A buffer layer BFL is located on the base layer SUB. The buffer layer BFL improves a coupling force between the base layer SUB and the conductive patterns or the semiconductor patterns. The buffer layer BFL includes an inorganic layer. In other embodiments, a barrier layer may be further located on the base layer SUB to prevent foreign substances from entering. The buffer layer BFL and the barrier layer may be selectively used or omitted.

The base layer SUB may include a plastic substrate, a glass substrate, or a metal substrate. The plastic substrate includes at least one of an acryl-based resin, a methacryl-based resin, polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

The first oxide semiconductor pattern OSP1 is located on the buffer layer BFL. The first oxide semiconductor pattern OSP1 includes indium tin oxide (ITO), indium gallium zinc oxide (IGZO), zinc oxide (ZnO), or indium zinc oxide (IZO).

A first insulating layer 10 is located on the buffer layer BFL to cover the first oxide semiconductor pattern OSP1.

The first control electrode GE1 is located on the first insulating layer 10, and a second insulating layer 20 is located on the first insulating layer 10 to cover the first control electrode GE1. The second insulating layer 20 provides a flat upper surface/planarized surface. The second insulating layer 20 includes an organic material and/or an inorganic material.

The first insulating layer 10 and the second insulating layer 20 include an inorganic material, which may include at least one of aluminum oxide, titanium oxide, silicon oxide, silicon oxynitride, zirconium oxide, and hafnium oxide Meanwhile, a first contact hole CH1 and a second contact hole CH2 are defined through the first and second insulating layers 10 and 20 to respectively expose a first area and a second area of the first oxide semiconductor pattern OSP1. Each of the first and second contact holes CH1 and CH2 penetrates through the first and second insulating layers 10 and 20.

The first input electrode DE1 and the first output electrode SE1 are located on the second insulating layer 20. The first input electrode DE1 and the first output electrode SE1 are respectively connected to the first area and the second area of the first oxide semiconductor pattern OSP1 through the first contact hole CH1 and the second contact hole CH2.

A third insulating layer 30 is located on the second insulating layer 20 to cover the first input electrode DE1 and the first output electrode SE1. The third insulating layer 30 provides a flat upper surface. The third insulating layer 30 includes an organic material and/or an inorganic material. The third insulating layer 30 covers input electrodes and output electrodes.

FIG. 6C shows the sixth transistor T6 having substantially the same structure as the second transistor T2. However, the structure of the sixth transistor T6 may be changed. The sixth transistor T6 includes an input electrode DE6 connected to the output electrode SE2 of the second transistor T2 on the second insulating layer 20.

The organic light emitting diode OLED and a pixel definition layer PDL are located on the third insulating layer 30. An anode AE is located on the third insulating layer 30. The anode AE is connected to a sixth output electrode SE6 of the sixth transistor T6 through a seventh contact hole CH7 defined through the third insulating layer 30. The pixel definition layer PDL is provided with an opening OP defined therethrough. At least a portion of the anode AE is exposed through the opening OP of the pixel definition layer PDL.

The pixel PX is located in a pixel area of the organic light emitting display panel DP when viewed in a plan view. The pixel area includes a light emitting area PXA and a non-light emitting area NPXA next to the light emitting area PXA. The non-light emitting area NPXA is located to surround the light emitting area PXA. In the present embodiment, the light emitting area PXA is defined to correspond to the anode AE, but should not be limited thereto or thereby. The light emitting area PXA may be defined as an area in which a light is generated. The light emitting area PXA may be defined to correspond to a portion of the anode AE exposed through the opening OP.

A hole control layer HCL is commonly located in the light emitting area PXA and the non-light emitting area NPXA. Although not shown in figures, a common layer like the hole control layer HCL may be commonly formed in the plural pixels PX.

An organic light emitting layer EML is located on the hole control layer HCL. The organic light emitting layer EML is located only in an area corresponding to the opening OP. That is, the organic light emitting layer EML may be patterned into plural parts, and the parts may be respectively located in the pixels PX.

An electron control layer ECL is located on the organic light emitting layer EML. A cathode CE is located on the electron control layer ECL. The cathode CE is commonly located in the pixels PX.

The thin film encapsulation layer TFE is located on the cathode CE. The thin film encapsulation layer TFE is commonly located in the pixels PX. The thin film encapsulation layer TFE includes at least one inorganic layer and at least one organic layer. The thin film encapsulation layer TFE may include a plurality of inorganic layers and a plurality of organic layers alternately stacked with the inorganic layers.

In the present embodiment, the patterned organic light emitting layer EML is shown as a representative example, but the organic light emitting layer EML may be commonly located in the pixels PX. In this case, the organic light emitting layer EML may generate a white light. In addition, the organic light emitting layer EML may have a multi-layer structure.

In the present embodiment, the thin film encapsulation layer TFE directly covers the cathode CE. In the present embodiment, a capping layer may further cover the cathode CE, and the thin film encapsulation layer TFE may directly cover the capping layer.

Figure 7A:
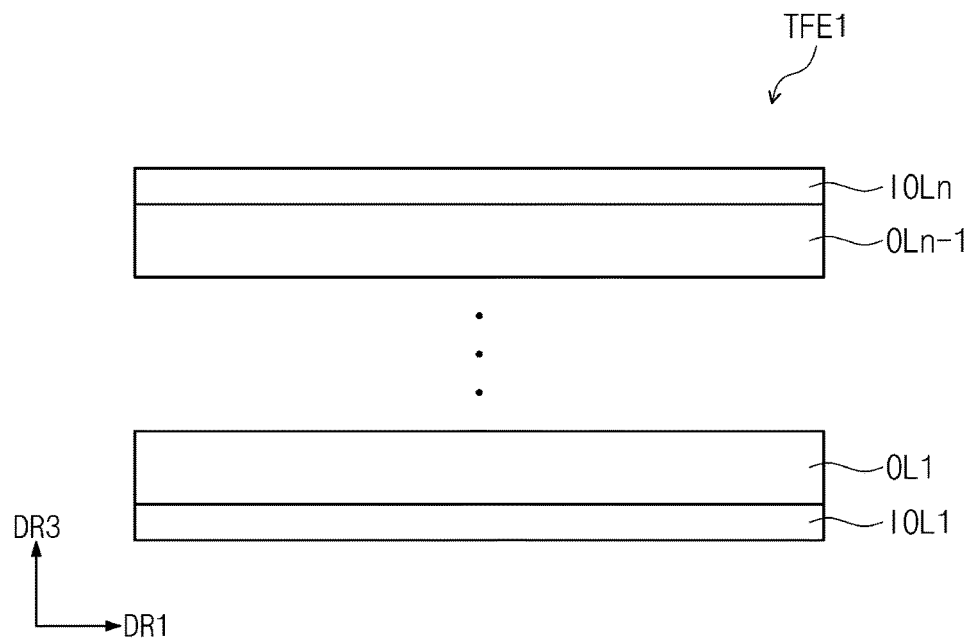
FIGS. 7A to 7C are cross-sectional views showing thin film encapsulation layers included in a display device according to an embodiment of the present disclosure.
Figure 7B:
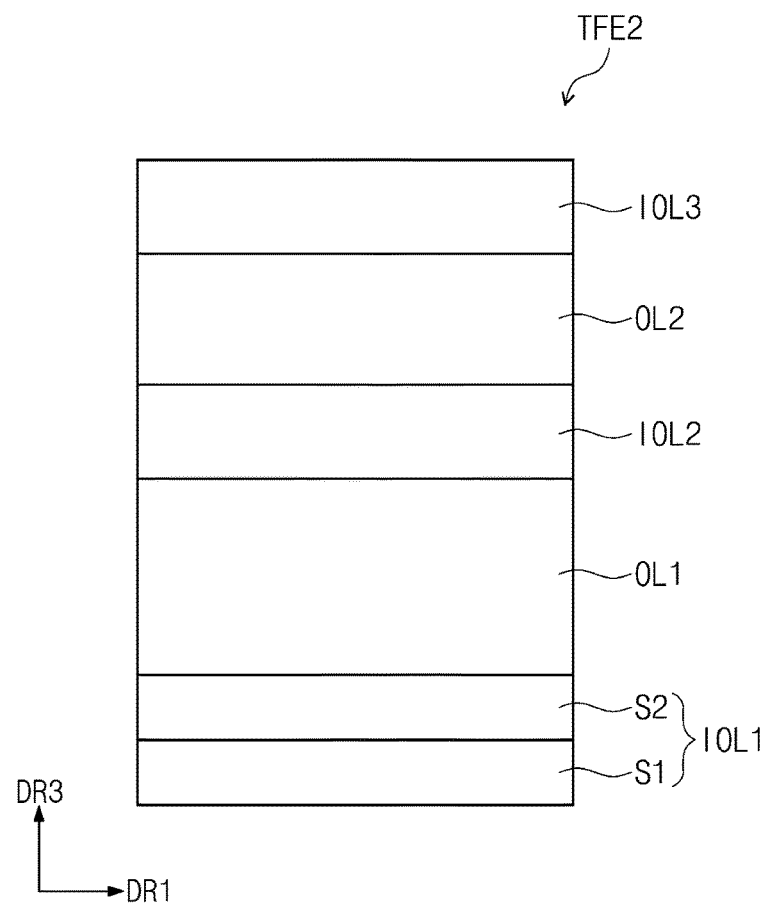
Figure 7C:
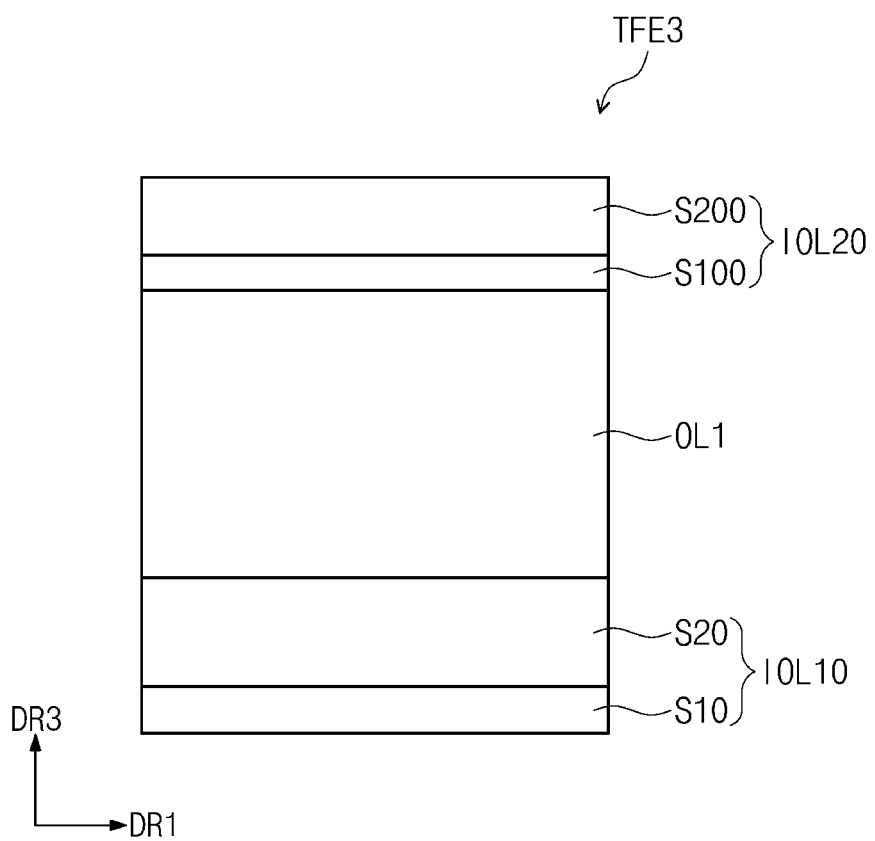

FIGS. 7A to 7C are cross-sectional views showing thin film encapsulation layers included in a display device according to an embodiment of the present disclosure. Hereinafter, the thin film encapsulation layer will be described in detail with reference to FIGS. 7A to 7C.

Referring to FIG. 7A, a thin film encapsulation layer TFE1 includes n inorganic thin layers IOL1 to IOLn, and a first inorganic thin layer IOL1 among the n inorganic thin layers IOL1 to IOLn is located on the cathode CE (refer to FIG. 6C). In addition, the first inorganic thin layer IOL1 may located to directly contact the cathode CE (refer to FIG. 6C). The first inorganic thin layer IOL1 may be referred to as a "lower inorganic thin layer," and the inorganic thin layers except for the first inorganic thin layer IOL1 among the n inorganic thin layers IOL1 to IOLn may be referred to as "upper inorganic thin layers."

The thin film encapsulation layer TFE1 includes n−1 organic thin layers OL1 to OLn−1, and the n−1 organic thin layers OL1 to OLn−1 are alternately arranged with the n inorganic thin layers IOL1 to IOLn. The n−1 organic thin layers OL1 to OLn−1 may have a thickness that is greater than that of the n inorganic thin layers IOL1 to IOLn.

Each of the n inorganic thin layers IOL1 to IOLn may have a single-layer structure containing one type of material, or may have a multi-layer structure containing plural different types of material. Each of the n−1 organic thin layers OL1 to OLn−1 may be formed by depositing organic monomers. Each of the n−1 organic thin layers OL1 to OLn−1 may be formed by using an inkjet printing method or by coating a composition containing an acryl-based monomer. In the present embodiment, the thin film encapsulation layer TFE1 may further include an n-th organic thin layer.

Referring to FIGS. 7B and 7C, the inorganic thin layers included in each of the thin film encapsulation layers TFE2 and TFE3 may include the same inorganic material, or may include different inorganic materials from each other, and may have the same thickness or different thicknesses. The organic thin layers included in each of the thin film encapsulation layers TFE2 and TFE3 may include the same organic material, or may include different organic materials from each other, and may have the same thickness or different thicknesses.

As shown in FIG. 7B, the thin film encapsulation layer TFE2 includes the first inorganic thin layer IOL1, the first organic thin layer OL1, the second inorganic thin layer IOL2, the second organic thin layer OL2, and the third inorganic thin layer IOL3, which are sequentially stacked.

The first inorganic thin layer IOL1 may have a two-layer structure. A first sub-layer S1 and a second sub-layer S2 of the first inorganic thin layer IOL1 may have different inorganic materials.

As shown in FIG. 7C, the thin film encapsulation layer TFE3 includes a first inorganic thin layer IOL10, a first organic thin layer OL1, and a second inorganic thin layer IOL20, which are sequentially stacked. The first inorganic thin layer IOL10 may have a two-layer structure. A first sub-layer S10 and a second sub-layer S20 included in the first inorganic thin layer IOL10 may have different inorganic materials. The second inorganic thin layer IOL20 may have a two-layer structure. The second inorganic thin layer IOL20 may include a first sub-layer S100 and a second sub-layer S200, which are deposited in different environments. The first sub-layer S100 may be deposited at lower power, and the second sub-layer S200 may be deposited at high power. The first and second sub-layers S100 and S200 may include the same inorganic material.

Figure 8A:
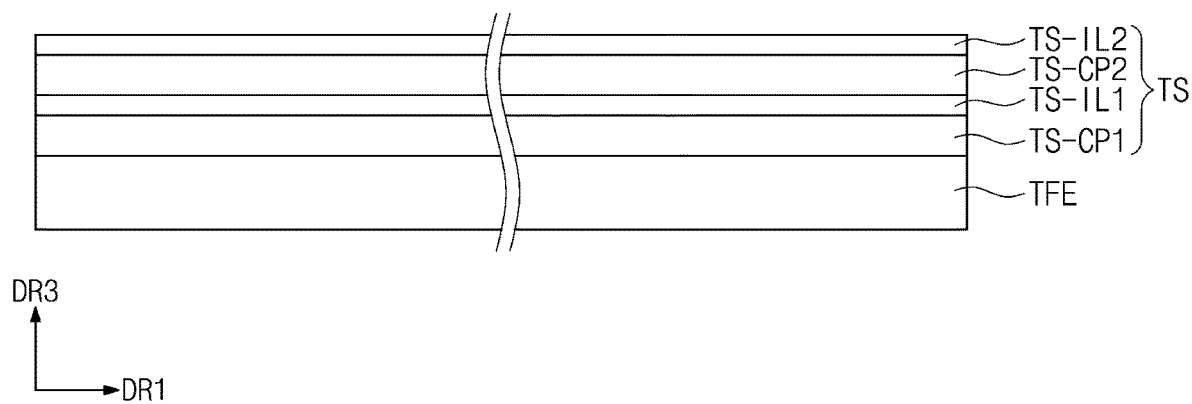
FIG. 8A is a cross-sectional view showing a touch sensing unit included in a display device according to an embodiment of the present disclosure.

FIG. 8A is a cross-sectional view showing a touch sensing unit included in a display device according to an embodiment of the present disclosure. FIGS. 8B to 8E are plan views showing a touch sensing unit included in a display device according to an embodiment of the present disclosure.

Referring to FIG. 8A, the touch sensing unit TS includes a first conductive pattern TS-CP1, a first insulating layer TS-IL1 (hereinafter, referred to as a "first touch insulating layer"), a second conductive pattern TS-CP2, and a second insulating layer TS-IL2 (hereinafter, referred to as a "second touch insulating layer"). The first conductive pattern TS-CP1 is directly located on the thin film encapsulation layer TFE, but it should not be limited thereto or thereby. That is, another inorganic layer (e.g., a buffer layer) may be further located between the first conductive pattern TS-CP1 and the thin film encapsulation layer TFE.

If suitable, the second touch insulating layer TS-IL2 may be omitted. A portion of the second conductive pattern TS-CP2 crosses the first conductive pattern TS-CP1. The portion of the second conductive pattern TS-CP2 is insulated from the first conductive pattern TS-CP1 while crossing the first conductive pattern TS-CP1, and the first touch insulating layer TS-IL1 is located between the first and second conductive patterns TS-CP1 and TS-CP2.

Each of the first conductive pattern TS-CP1 and the second conductive pattern TS-CP2 has a single-layer structure or a multi-layer structure of plural layers stacked in the third direction DR3.

Each of the first touch insulating layer TS-IL1 and the second touch insulating layer TS-IL2 includes an inorganic material or an organic material. The inorganic material includes at least one of aluminum oxide, titanium oxide, silicon oxide, silicon nitride, silicon oxynitride, zirconium oxide, and hafnium oxide. The organic material includes at least one of an acryl-based resin, a methacryl-based resin, polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

The first touch insulating layer TS-IL1 should not be limited to a specific shape if the first touch insulating layer TS-IL1 insulates the first conductive pattern TS-CP1 and the second conductive pattern TS-CP2. The first touch insulating layer TS-IL1 entirely covers the thin film encapsulation layer TFE or includes a plurality of insulating patterns. The insulating patterns are overlapped with first connection parts BR1 and second connection parts BR2 described later.

In the present embodiment, the two-layer type touch sensing unit has been described, but the touch sensing unit should not be limited to the two-layer type. A single-layer type touch sensing unit includes a conductive layer and an insulating layer covering the conductive layer. The conductive layer includes touch sensors and touch signal lines connected to the touch sensors. The single-layer type touch sensing unit obtains coordinate information using a self-capacitance method.

Figure 8B:
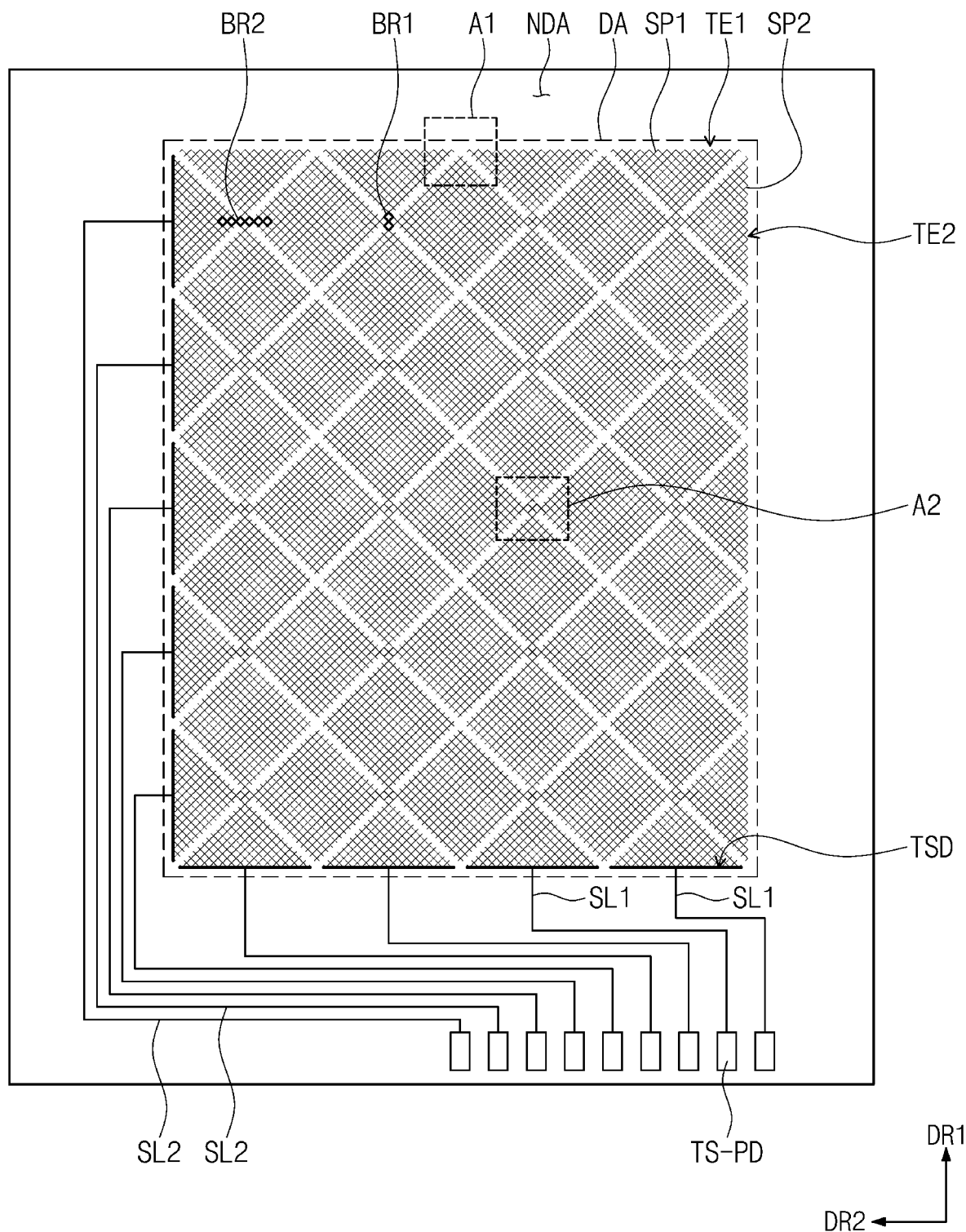
FIGS. 8B to 8E are plan views showing a touch sensing unit included in a display device according to an embodiment of the present disclosure.

Referring to FIG. 8B, the touch sensing unit TS includes first touch electrodes TE1 and second touch electrodes TE2. The first touch electrodes TE1 include the first connection parts BR1, first touch sensor parts SP1 connected by the first connection parts BR1, and first touch signal lines SL1 connected to the first touch sensor parts SP1. The second touch electrodes TE2 include the second connection parts BR2, second touch sensor parts SP2 connected by the second connection parts BR2, and second touch signal lines SL2 connected to the second touch sensor parts SP2. In addition, connection electrodes TSD may be located between the first touch electrodes TE1 and the first touch signal lines SL1, and between the second touch electrodes TE2 and the second touch signal lines SL2 connected to the second touch electrodes TE2. The connection electrodes TSD are connected to ends of the first and second touch electrodes TE1 and TE2 to transmit signals. According to another embodiment, the connection electrodes TSD may be omitted.

The first touch sensor parts SP1 are arranged in the first direction DR1, and the second touch sensor parts SP2 are arranged in the second direction DR2. The first touch sensor parts SP1 are spaced apart from the second touch sensor parts SP2.

The first touch electrodes TE1 extend in the first direction DR1 and are spaced apart from each other in the second direction DR2. The second touch electrodes TE2 extend in the second direction DR2 and are spaced apart from each other in the first direction DR1.

Each of the first connection parts BR1 connects two adjacent first touch sensor parts SP1 among the first touch sensor parts SP1. Each of the second connection parts BR2 connects two adjacent second touch sensor parts SP2 among the second touch sensor parts SP2. In FIG. 8B, portions of the first and second connection parts BR1 and BR2 are represented by a bold dot to help description.

The touch sensing unit TS may further include touch pad parts TS-PD. Each of the first and second touch signal lines SL1 and SL2 may be connected to a corresponding touch pad part of the touch pad parts TS-PD.

The first touch sensor parts SP1 are capacitively coupled to the second touch sensor parts SP2. When the touch sensing signals are applied to the first touch sensor parts SP1, capacitors are formed between the first touch sensor parts SP1 and the second touch sensor parts SP2.

Hereinafter, the touch sensing unit TS will be described in more detail with reference to FIGS. 8C to 8E.

Figure 8C:
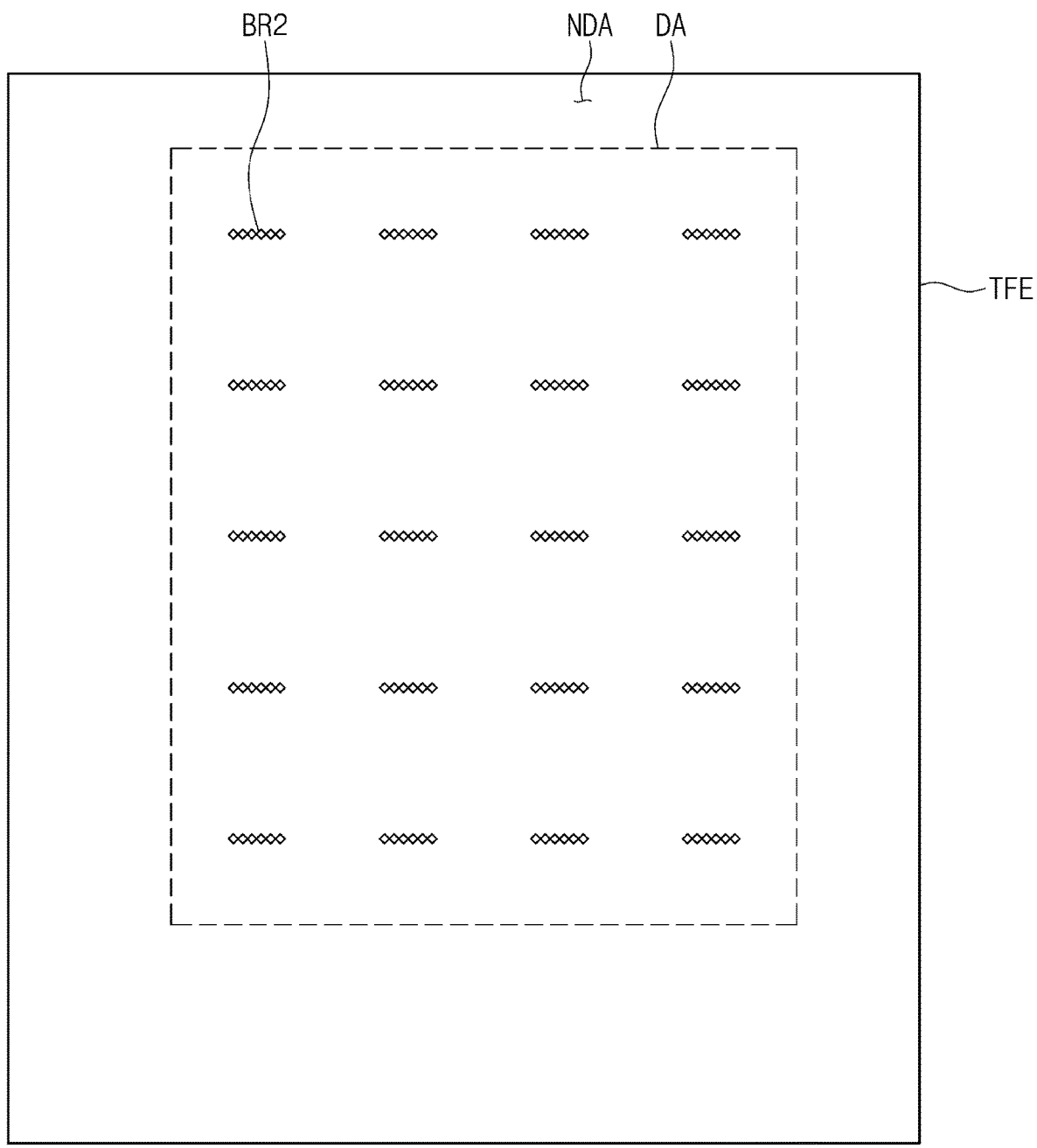
Figure 8D:
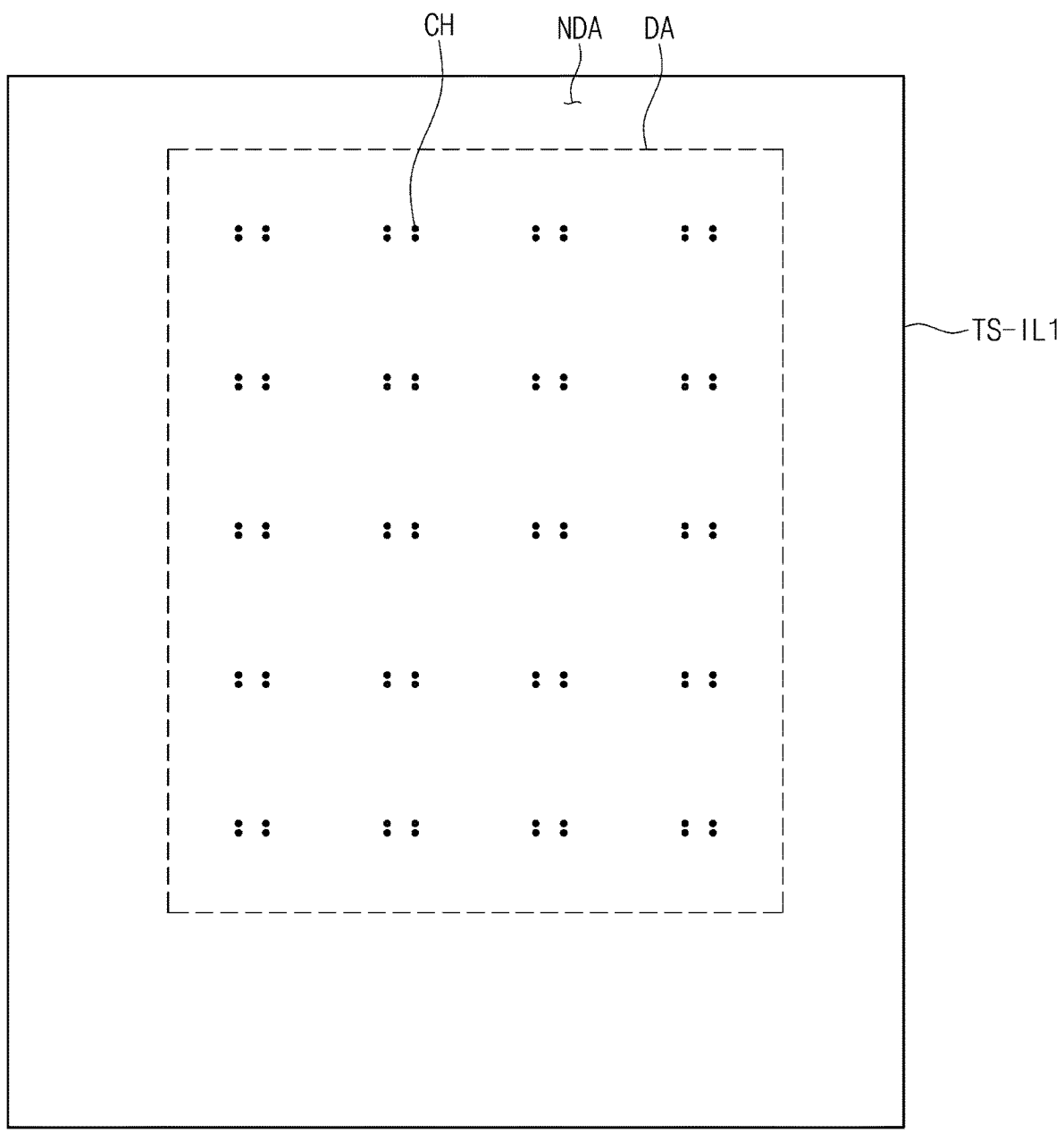

Referring to FIG. 8C, the first conductive patterns TS-CP1 may include the second connection parts BR2. The second connection parts BR2 may be directly formed on the thin film encapsulation layer TFE by a patterning process. That is, the first conductive patterns TS-CP1 may be directly located on the thin film encapsulation layer TFE of the organic light emitting display panel DP.

The first touch insulating layer TS-IL1 is located on the first conductive patterns TS-CP1. The first touch insulating layer TS-IL1 is directly located on the thin film encapsulation layer TFE of the organic light emitting display panel DP and covers the second connection parts BR2. As shown in FIG. 8D, a plurality of contact holes CH is defined through the first touch insulating layer TS-IL1 to partially expose the second connection parts BR2. The contact holes CH are formed by a photolithography process. The second connection parts BR2 of the first conductive pattern TS-CP1 are electrically connected to the second touch sensor parts SP2 through the contact holes CH.

Figure 8E:
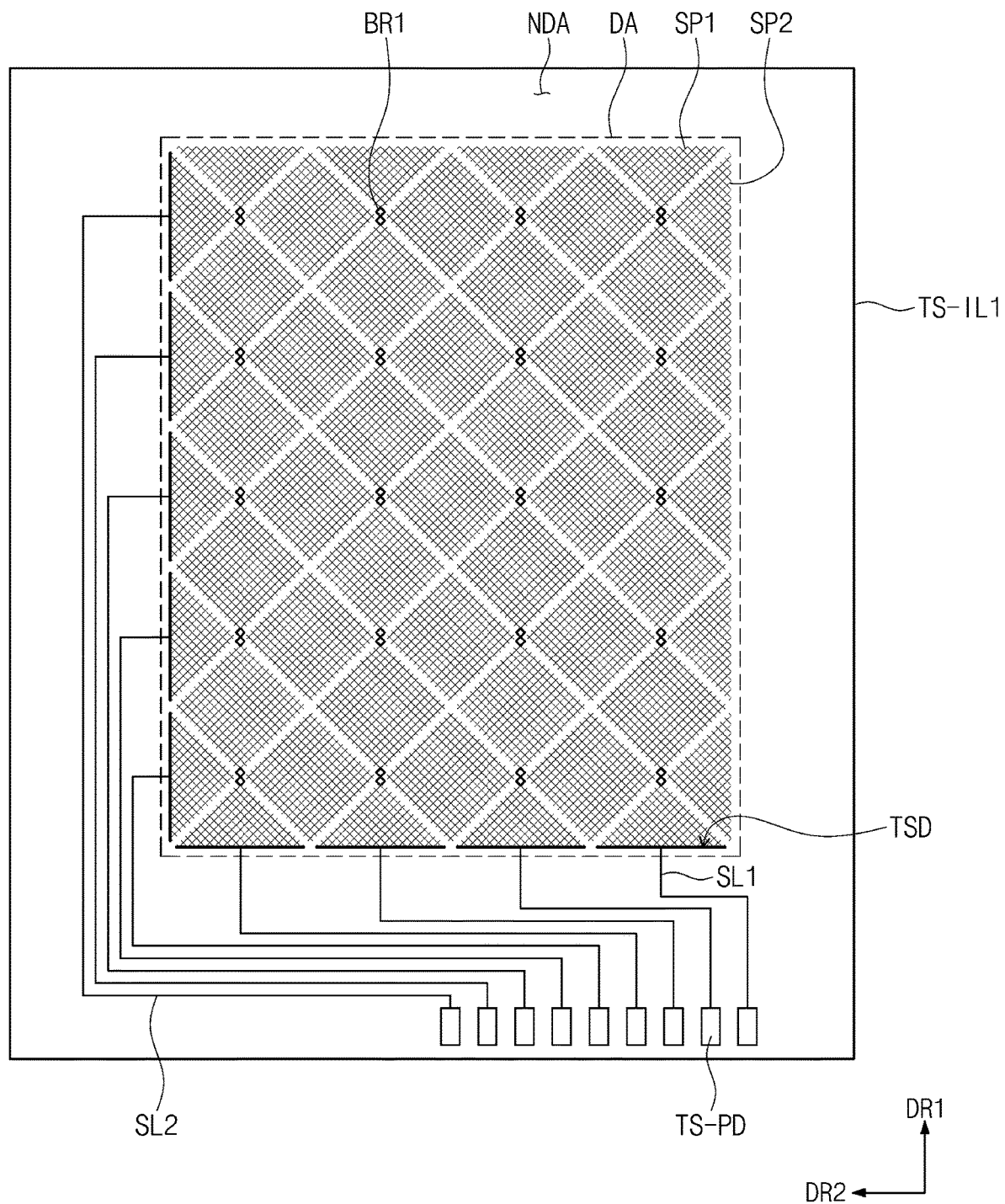

Referring to FIG. 8E, the second conductive patterns TS-CP2 are located on the first touch insulating layer TS-IL1. The second conductive patterns TS-CP2 include the first connection parts BR1, the first touch sensor parts SP1 connected by the first connection parts BR1, and the second touch sensor parts SP2 spaced apart from the first touch sensor parts SP1. As described above, the second touch sensor parts SP2 are electrically connected to the second connection parts BR2 of the first conductive pattern TS-CP1 through contact holes CH defined through the first touch insulating layer TS-IL1.

Figure 8F:
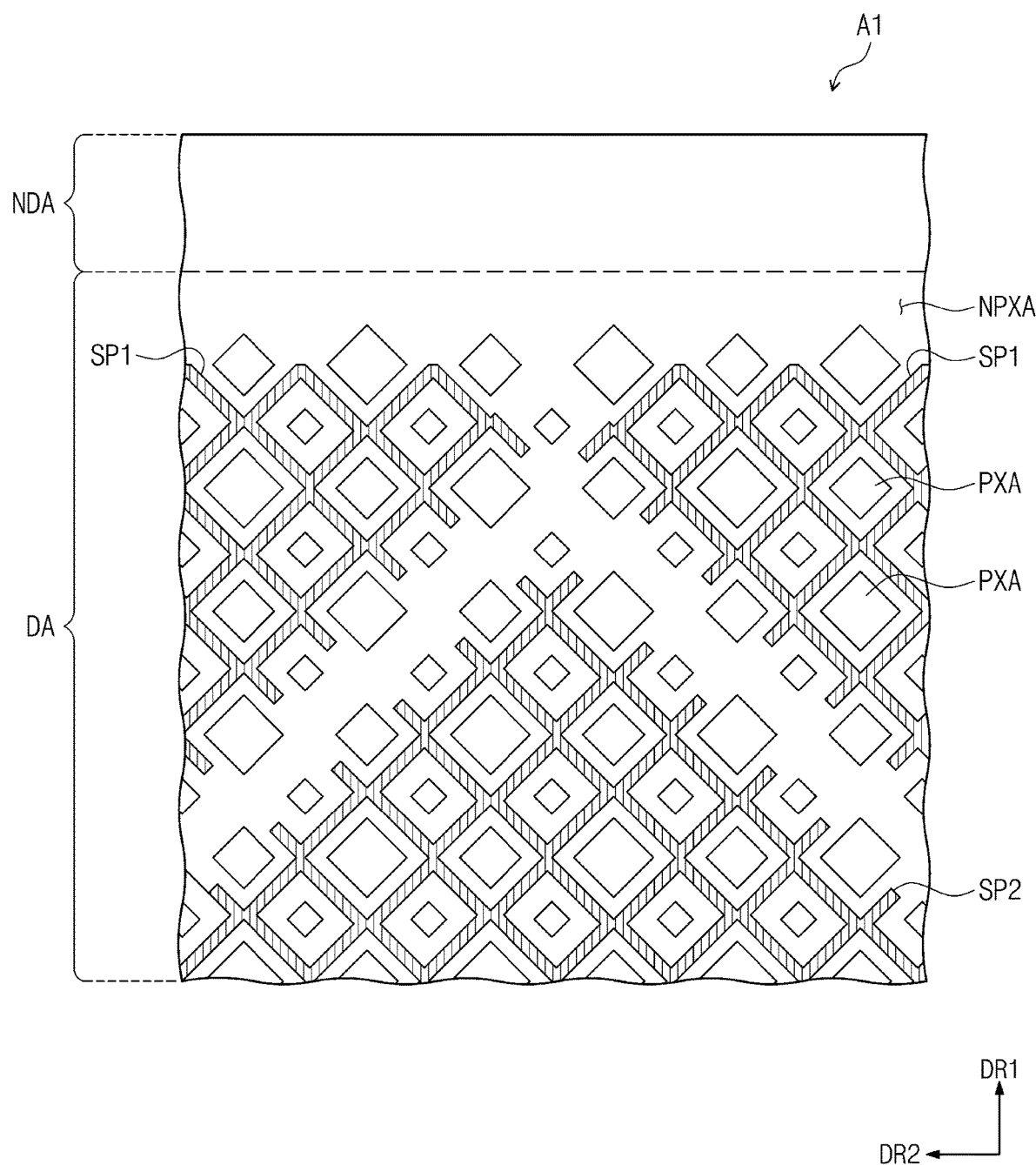
FIG. 8F is a partially enlarged view showing an area A1 of FIG. 8B.
Figure 9:
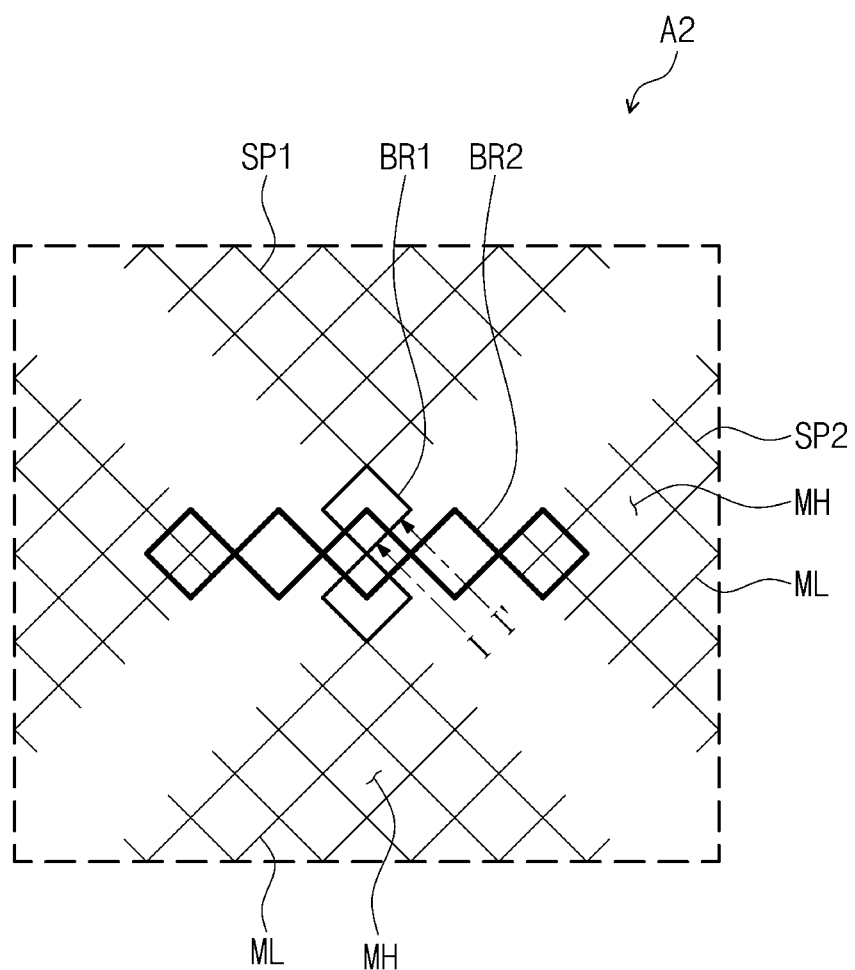
FIG. 9 is a partially enlarged view showing an area A2 of FIG. 8B.

FIG. 8F is a partially enlarged view showing an area A1 of FIG. 8B. FIG. 9 is a partially enlarged view showing an area A2 of FIG. 8B.

Referring to FIGS. 8F and 9, each of the first touch sensor parts SP1 and the second touch sensor parts SP2 may include a plurality of mesh lines ML to define a plurality of mesh holes MH. Each mesh line ML has a line width of a few micrometers, for example. Each of the first touch sensor part SP1 and the second touch sensor parts SP2 may have a mesh shape. Although not shown in detail, the first touch signal lines SL1 and the second touch signal lines SL2 may have the mesh shape. Each of the first touch sensor parts SP1 and the second touch sensor parts SP2 is overlapped with the non-light emitting area NPXA.

When viewed in a plan view, the mesh holes MH have different sizes from each other. The mesh holes MH may respectively correspond to the light emitting areas PXA in a one-to-one correspondence, but they should not be limited thereto or thereby. That is, one mesh hole may correspond to two or more light emitting areas PXA, for example. The light emitting areas PXA may have different sizes from each other when viewed in a plan view. Correspondingly, the mesh holes MH may have different sizes from each other when viewed in a plan view. For instance, the light emitting areas PXA may include a red light emitting area, a green light emitting area, and a blue light emitting area, and the light emitting areas PXA may have different sizes determined depending on their colors. However, the light emitting areas PXA may have the same size as each other, and the mesh holes MH may have the same size as each other.

Referring to FIG. 9, the first connection parts BR1 may cross the second connection parts BR2. The first connection parts BR1 and the second connection parts BR2 are insulated from each other by the first touch insulating layer TS-IL1 located between the first and second connection parts BR1 and BR2 while crossing each other. In FIG. 9, the first connection parts BR1 and the second connection parts BR2 are represented by bold lining to aid in description, but they should not be limited thereto or thereby. For instance, the first connection parts BR1 may not cross the second connection parts BR2, and this structure will be described in detail later.

As shown in FIG. 9, each of the first connection parts BR1 and the second connection parts BR2 may have the mesh shape. However, the second connection parts BR2 may not have the mesh shape in other embodiments.

Figure 10A:
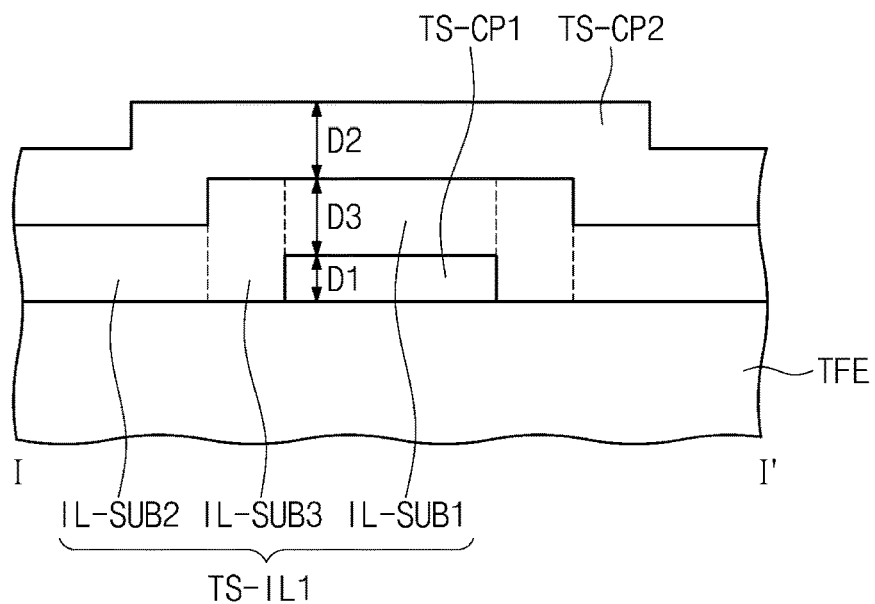
FIGS. 10A and 10B are cross-sectional views taken along the line I-I' of FIG. 9.
Figure 10B:
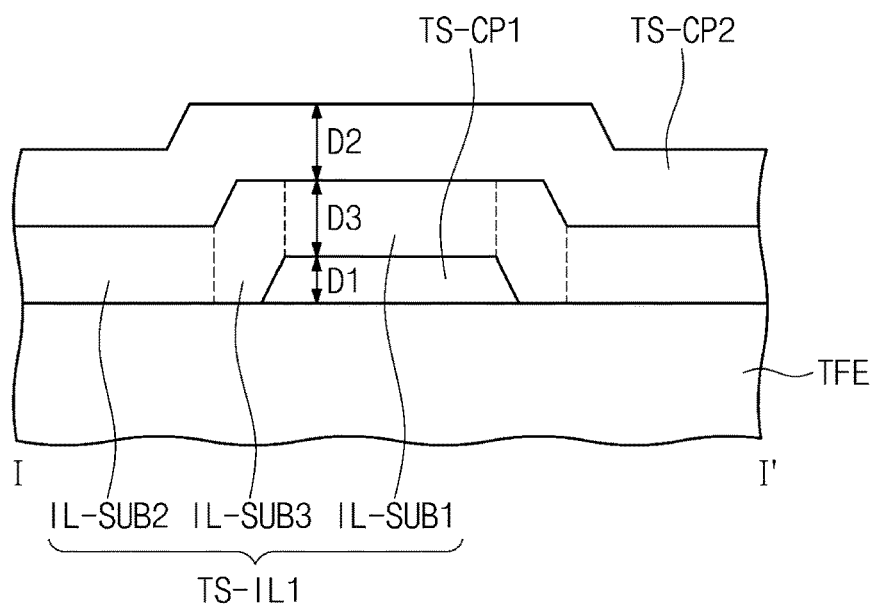

FIGS. 10A and 10B are cross-sectional views taken along the line I-I' of FIG. 9.

Referring to FIGS. 10A and 10B, the first conductive pattern TS-CP1 has a thickness D1 that is smaller than a thickness D2 of the second conductive pattern TS-CP2. The first conductive pattern TS-CP1 shown in FIGS. 10A and 10B corresponds to the second connection part BR2. The thickness D1 of the first conductive pattern TS-CP1 may be smaller than a thickness D3 of the first touch insulating layer TS-IL1.

In the present description, the term "thickness" denotes an average value of the thickness, or general thickness, in a corresponding component.

As described above, the first conductive pattern TS-CP1 and the first touch insulating layer TS-IL1 may be directly located on the thin film encapsulation layer TFE of the organic light emitting display panel DP. The first touch insulating layer TS-IL1 has a structure in which a step difference exists. In detail, the first touch insulating layer TS-IL1 is located on the first conductive pattern TS-CP1 and includes a first part IL-SUB1 spaced apart from the thin film encapsulation layer TFE, a second part IL-SUB2 making contact with the thin film encapsulation layer TFE, and a third part IL-SUB3 connecting the first part IL-SUB1 and the second part IL-SUB2. The first part IL-SUB1, the second part IL-SUB2, and the third part IL-SUB3 are integrally connected to each other.

The third part IL-SUB3 may have a rectangular shape when viewed in a cross section, but the shape of the third part IL-SUB3 should not be limited to the rectangular shape. That is, the third part IL-SUB3 may have a polygonal shape including an inclined surface when viewed in a cross section.

Figure 11:
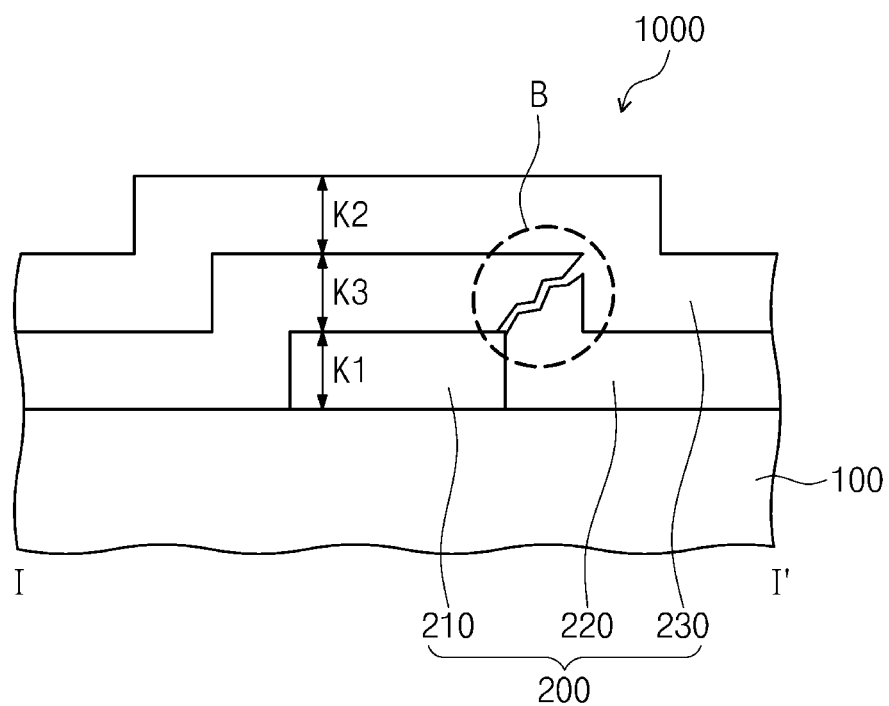
FIG. 11 is a cross-sectional view showing a touch sensing unit included in a conventional display device.

FIG. 11 is a cross-sectional view showing a touch sensing unit included in a conventional display device 1000. In detail, the conventional display device 1000 shown in FIG. 11 includes a display panel 100 and a touch sensing unit 200 located on the display panel 100.

The touch sensing unit 200 of the conventional display device 1000 includes a first conductive pattern 210, an insulating layer 220 covering the first conductive pattern 210, and a second conductive pattern 230 located on the insulating layer 220, and a thickness K1 of the first conductive pattern 210 is substantially equal to or slightly different from a thickness K2 of the second conductive pattern 230. In more detail, the thickness K1 of the first conductive pattern 210, a thickness K3 of the insulating layer 220, and the thickness K2 of the second conductive pattern 230 are substantially equal to each other or slightly different from each other. A step difference occurs in the insulating layer 220 due to the first conductive pattern 210 covered by the insulating layer 220, and a crack occurs at an area in which the step difference exists, as shown in the area B of FIG. 11. Due to the crack occurring in the insulating layer 220, the first conductive pattern 210 is electrically connected to a portion of the second conductive pattern 230 crossing the first conductive pattern 210, and as a result, a short (e.g., electrical short) defect of the touch sensing unit 200 is generated.

According to the display device DD of the present disclosure, the thickness D1 of the first conductive pattern TS-CP1 is smaller than that of the conventional first conductive pattern 210, and thus the step difference occurring in the first touch insulating layer TS-IL1 becomes small, thereby minimizing the occurrence of the crack in the insulating layer. To effectively achieve the effect, the thickness D1 of the first conductive pattern TS-CP1 may be suitably less than the thickness D3 of the first touch insulating layer TS-IL1. The thickness D3 of the first touch insulating layer TS-IL1 and the thickness D2 of the second conductive pattern TS-CP2 are substantially equal to each other, or are slightly different from each other. That is, only the thickness D1 of the first conductive pattern TS-CP1 among the first conductive pattern TS-CP1, the first touch insulating layer TS-IL1, and the second conductive pattern TS-CP2 is set to be relatively thin in the display device DD according to the present embodiment, and thus the first touch insulating layer TS-IL1 may be prevented from being cracked, or the crack of the first touch insulating layer TS-IL1 may be reduced or minimized.

For instance, the thickness D1 of the first conductive pattern TS-CP1 is equal to or greater than about 1800 angstroms, and equal to or less than about 2100 angstroms, and the thickness D2 of the second conductive pattern TS-CP2 is equal to or greater than about 2700 angstroms and equal to or less than about 3500 angstroms. As an example, the thickness D1 of the first conductive pattern TS-CP1 may be about 1950 angstroms, and the thickness D2 of the second conductive pattern TS-CP2 may be about 3100 angstroms, but they should not be limited thereto or thereby.

In the present embodiment, the thickness D3 of the first touch insulating layer TS-IL1 is equal to or greater than about 2700 angstroms, and equal to or less than about 3500 angstroms. As an example, the thickness D3 of the first touch insulating layer TS-IL1 may be about 3100 angstroms, but it should not be limited thereto or thereby.

Figure 12A:
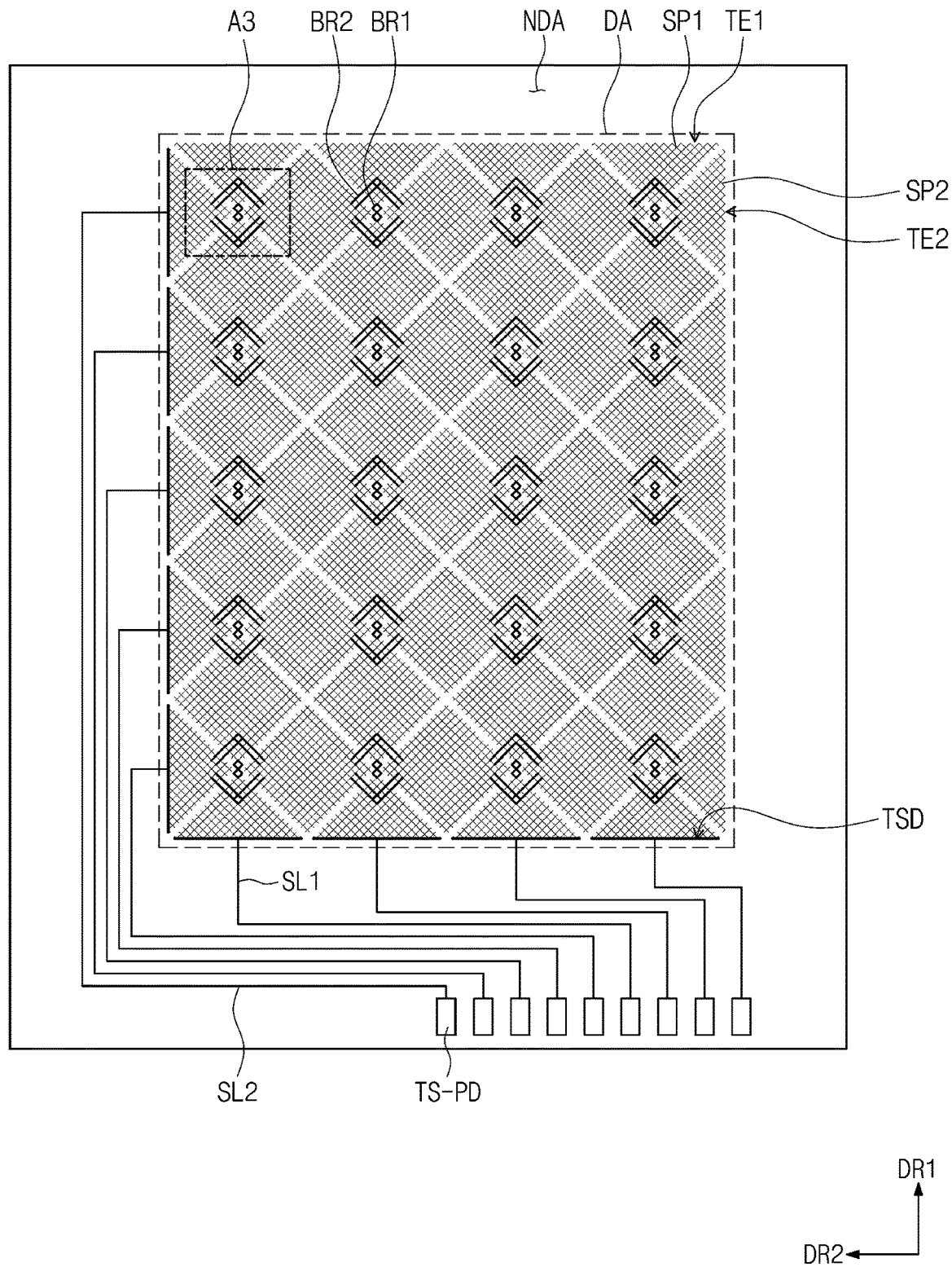
FIGS. 12A to 12D are plan views showing a touch sensing unit included in a display device according to an embodiment of the present disclosure.
Figure 12B:
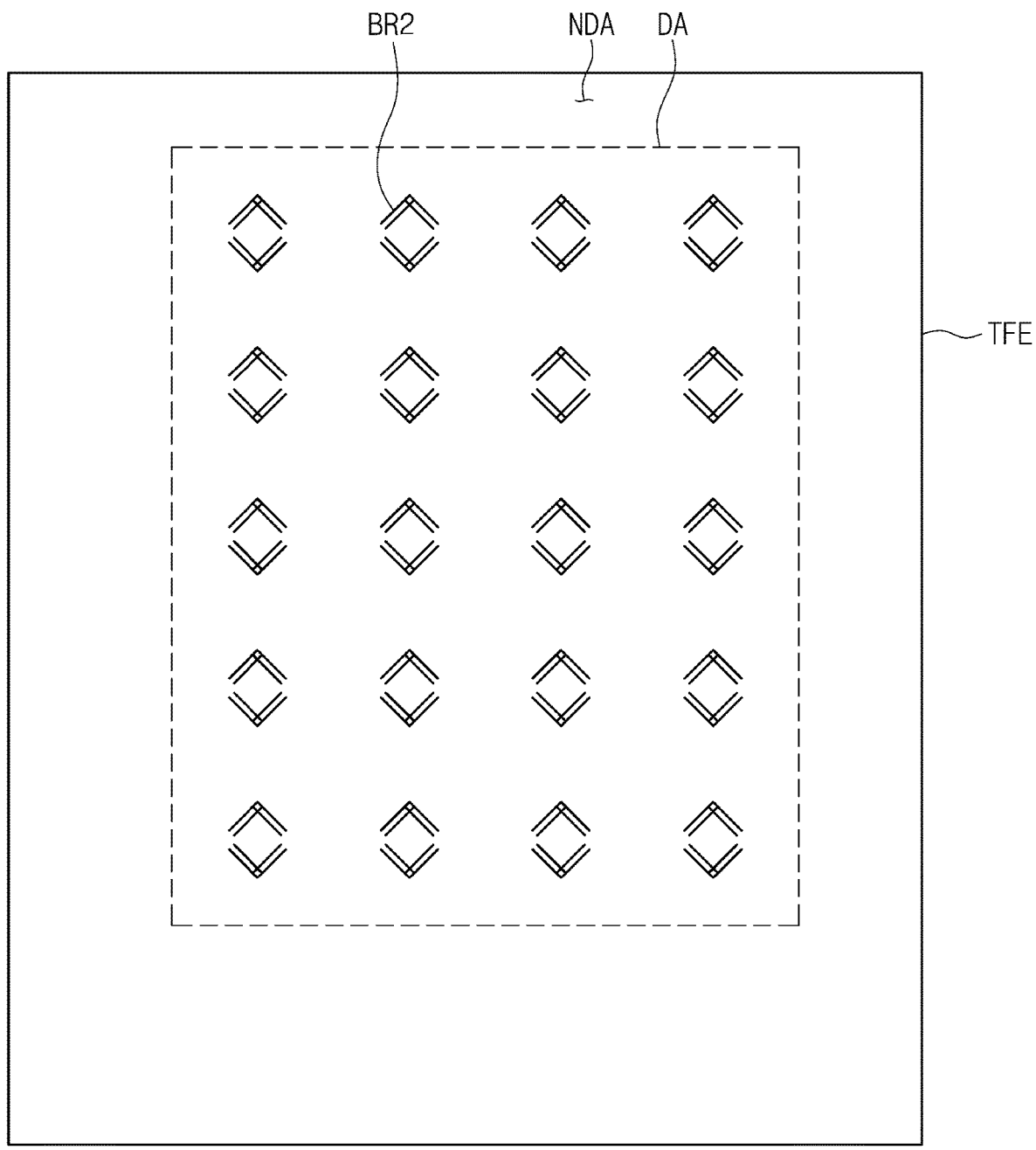
Figure 12C:
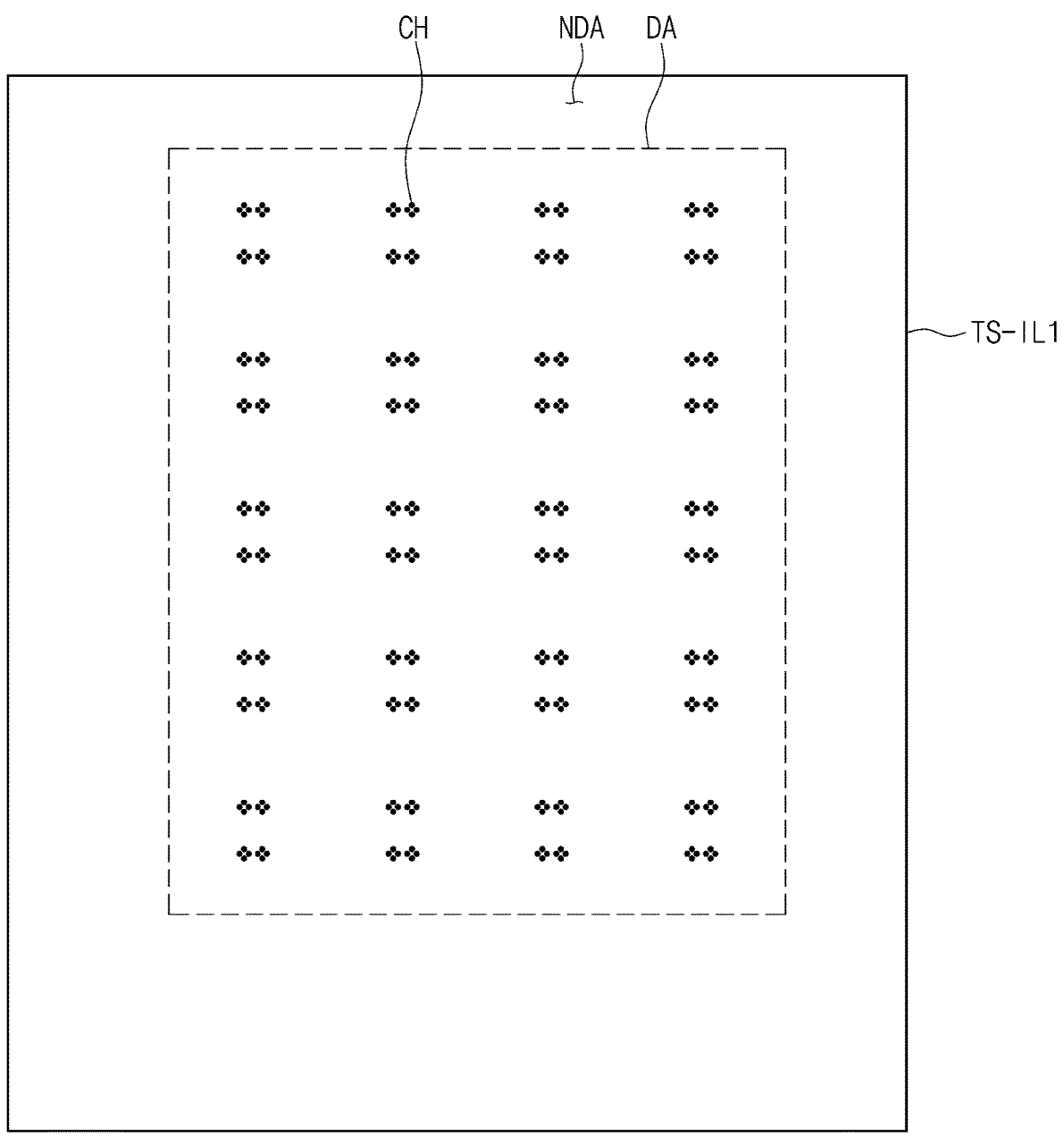
Figure 12D:
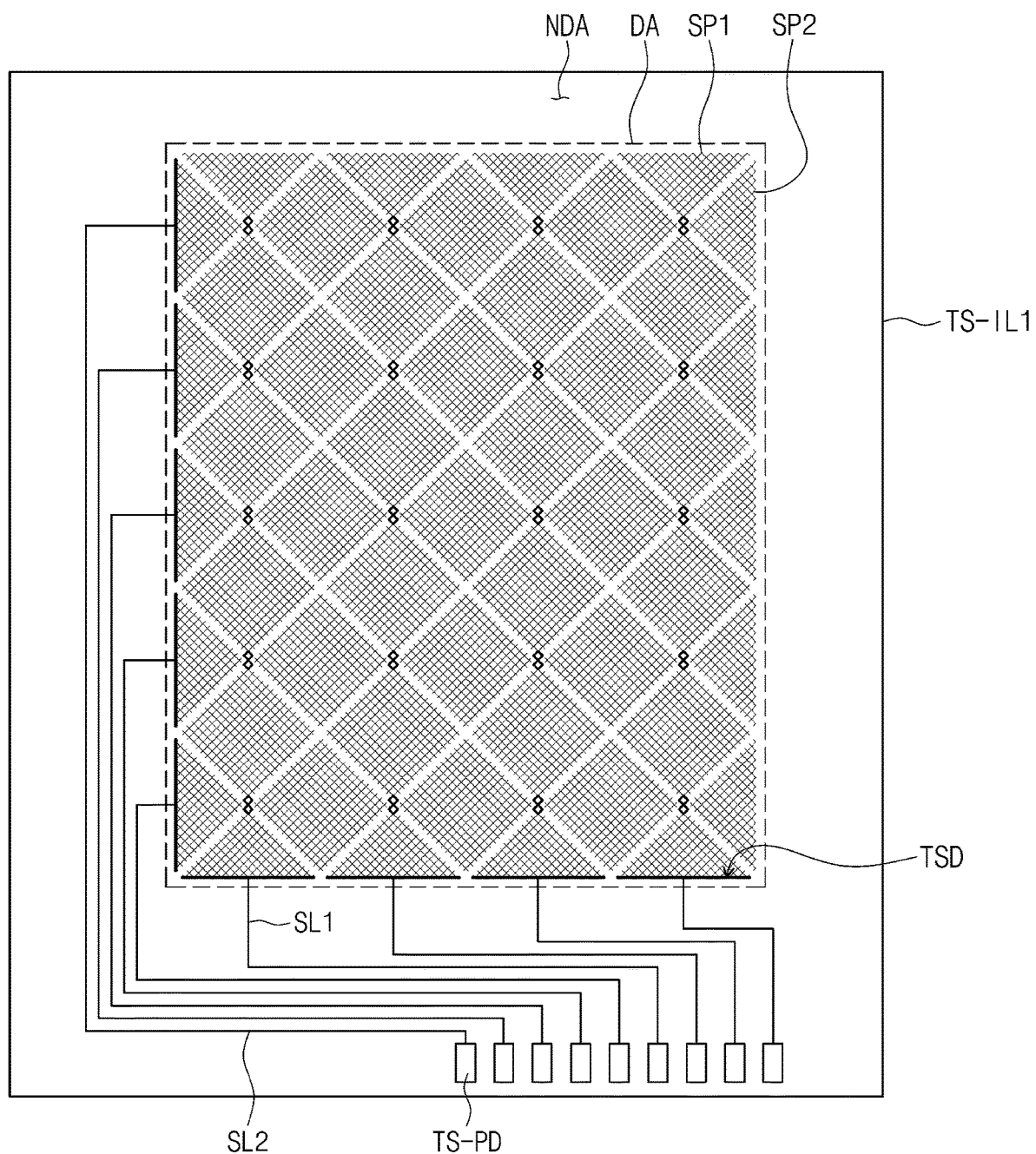
Figure 13A:
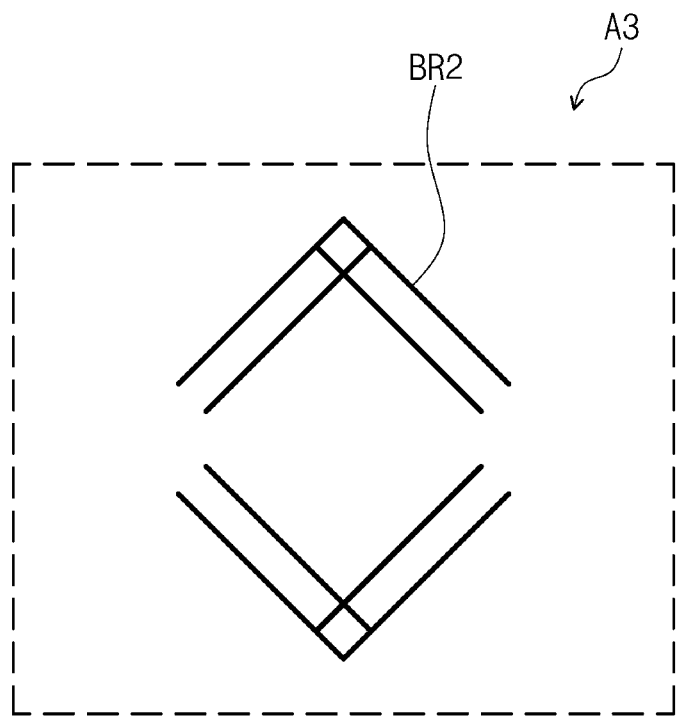
FIGS. 13A to 13C are partially enlarged views showing an area A3 of FIG. 12A.
Figure 13B:
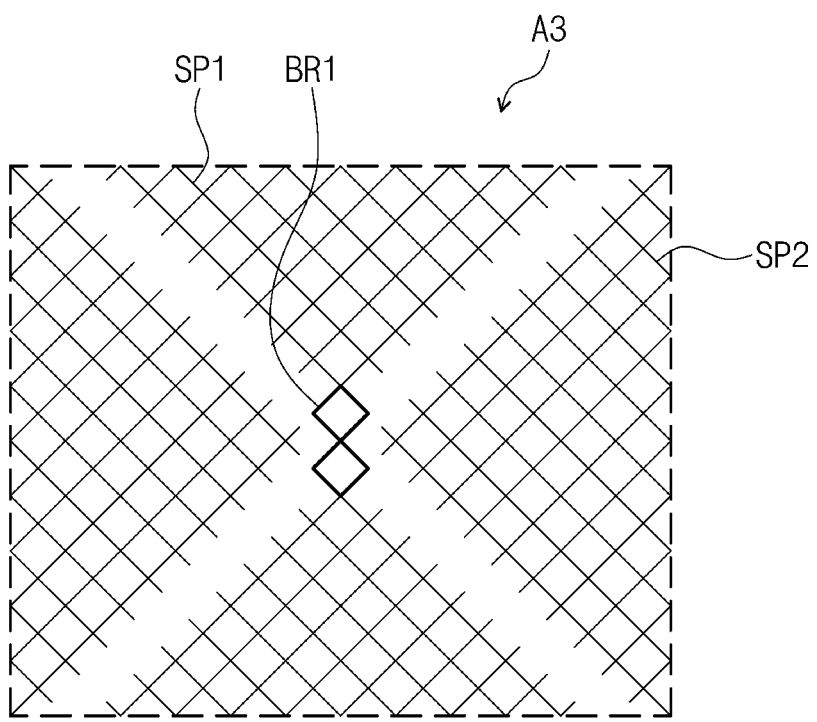
Figure 13C:
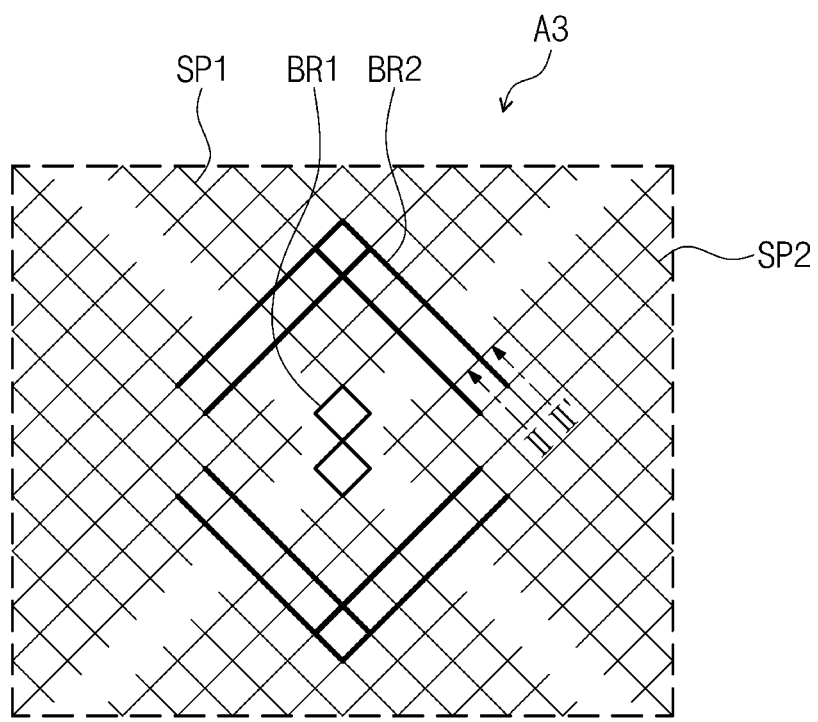

FIGS. 12A to 12D are plan views showing a touch sensing unit included in a display device according to other embodiments of the present disclosure. FIGS. 13A to 13C are partially enlarged views showing an area A3 of FIG. 12A. In detail, FIG. 13A shows second connection parts BR2 included in a first conductive pattern TS-CP1 in the area A3 of FIG. 12A, FIG. 13B shows a second conductive pattern TS-CP2 in the area A3, and FIG. 13C shows a stack structure of the first conductive pattern TS-CP1 and the second conductive pattern TS-CP2.

As described above, the first connection parts BR1 might not cross the second connection parts BR2. Referring to FIGS. 12A to 12D, the second connection parts BR2 do not cross the first connection parts BR1, and the second connection parts BR2 cross the first touch sensor parts SP1 and the second touch sensor parts SP2. Referring to FIGS. 13A to 13C, the first touch sensor parts SP1 include the mesh lines ML defining the mesh holes MH as described above, and each of the second connection parts BR2 crosses a portion of the mesh lines ML of the first touch sensor parts SP1. The second touch sensor parts SP2 include the mesh lines ML defining the mesh holes MH as described above, and each of the second connection parts BR2 crosses a portion of the mesh lines ML of the second touch sensor parts SP2. In this case, the second connection parts BR2 may not have the mesh shape.

The descriptions with reference to FIGS. 8B to 8E may be applied to the touch sensing unit shown in FIGS. 12A to 12D except for the descriptions of the second connection parts BR2, and thus repeated detailed descriptions of the touch sensing unit with reference to FIGS. 12A to 12D will be omitted except for the second connection parts BR2.

Figure 14:
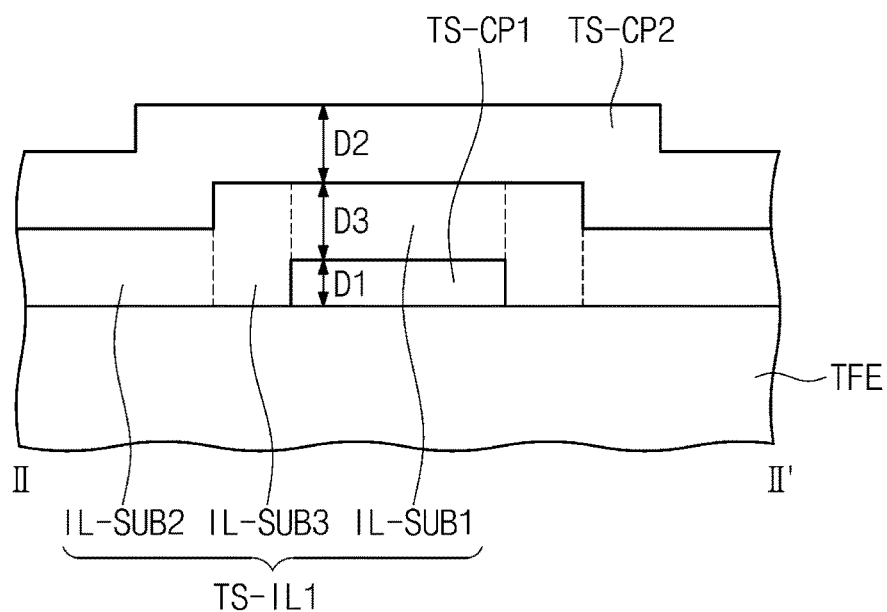
FIG. 14 is a cross-sectional view taken along the line II-II' of FIG. 13C.

FIG. 14 is a cross-sectional view taken along the line II-II' of FIG. 13C. The descriptions with reference to FIGS. 10A and 10B may be applied to the touch sensing unit shown in FIG. 14, except that difference features between the structure in which the second conductive pattern TS-CP2 shown in FIGS. 10A and 10B corresponds to the first connection parts BR1 among components of the second conductive pattern TS-CP2 and the structure in which the second conductive pattern TS-CP2 shown in FIG. 14 corresponds to the first touch sensor parts SP1 among components of the second conductive pattern TS-CP2, and thus repeated detailed descriptions of the touch sensing unit with reference to FIG. 14 will be omitted, although different features will be described.

Figure 15:
FIG. 15 is a cross-sectional view showing a portion of a touch sensing unit included in a display device according to an embodiment of the present disclosure.

FIG. 15 is a cross-sectional view showing a portion of a touch sensing unit included in a display device according to an embodiment of the present disclosure.

The first conductive pattern TS-CP1 may have a single-layer structure or a multi-layer structure. As shown in FIG. 15, the first conductive pattern TS-CP1 may have a triple-layer structure. The first conductive pattern TS-CP1 may include a first conductive layer CD1, a second conductive layer CD2, and a third conductive layer CD3. The first conductive layer CD1 is located on the thin film encapsulation layer TFE of the display panel DP, the second conductive layer CD2 is located on the first conductive layer CD1, and the third conductive layer CD3 is located on the second conductive layer CD2. In this case, an entire thickness D1 of the first conductive pattern TS-CP1 corresponds to a sum of a thickness G1 of the first conductive layer CD1, a thickness G2 of the second conductive layer CD2, and a thickness G3 of the third conductive layer CD3.

The second conductive layer CD2 has an electrical resistivity smaller than that of each of the first conductive layer CD1 and the third conductive layer CD3. That is, the second conductive layer CD2 has a superior electrical conductivity when compared to that of each of the first conductive layer CD1 and the third conductive layer CD3. Each of the first, second, and third conductive layers CD1, CD2, and CD3 may include typical materials as long as the first, second, and third conductive layers CD1, CD2, and CD3 satisfy the above-mentioned relation. For instance, each of the first, second, and third conductive layers CD1, CD2, and CD3 may include silver, copper, aluminum, titanium, molybdenum, or an alloy thereof. As another example, each of the first and third conductive layers CD1 and CD3 may include titanium (Ti), and the second conductive layer CD2 may include aluminum (Al).

The thickness G2 of the second conductive layer CD2 may be greater than the thickness G1 of the first conductive layer CD1 and the thickness G3 of the third conductive layer CD3. The thickness G2 of the second conductive layer CD2 may be, for example, six times greater than the thickness G1 of the first conductive layer CD1. The thickness G2 of the second conductive layer CD2 may be, for example, four times greater than the thickness G3 of the third conductive layer CD3.

The thickness G3 of the third conductive layer CD3 may be greater than the thickness G1 of the first conductive layer CD1. The thickness G3 of the third conductive layer CD3 may be, for example, one and half times greater than the thickness G1 of the first conductive layer CD1. In other embodiments, the thickness G3 of the third conductive layer CD3 may be, for example, one and half times to three times greater than the thickness G1 of the first conductive layer CD1.

The second conductive layer CD2 is an essential component for the first conductive pattern CP1 to serve as a conductive pattern, and the first and third conductive layers CD1 and CD3 serve as a protective layer protecting the second conductive layer CD2 to obtain a process stability. In detail, the first conductive layer CD1 protects the second conductive layer CD2 from defects occurring under the touch sensing unit TS, and the third conductive layer CD3 prevents the second conductive layer CD2 from being damaged during an etching process.

As described above, because the first conductive layer CD1 and the third conductive layer CD3 have different purposes, the first conductive layer CD1 and the third conductive layer CD3 may suitably have different thicknesses. That is, because the third conductive layer CD3 may suitably have a predetermined thickness or more such that the second conductive layer CD2 is protected in the etching process, only the thickness G1 of the first conductive layer CD1 is controlled to be small, and thus the entire thickness D1 of the first conductive pattern CP1 may be smaller than the entire thickness D2 of the second conductive pattern CP2. However, the thickness G1 of the first conductive layer CD1 may still suitably have a predetermined thickness or more and, for example, the thickness G1 of the first conductive layer CD1 may be about 50 angstroms or more. In a case than the thickness G1 of the first conductive layer CD1 is less than about 50 angstroms, the first conductive layer CD1 might not serve as the protective layer protecting the second conductive layer CD2.

For instance, the thickness G1 of the first conductive layer CD1 is in a range from about 50 angstroms to about 200 angstroms, the thickness G2 of the second conductive layer CD2 is in a range from about 1000 angstroms to about 1800 angstroms, and the thickness G3 of the third conductive layer CD3 is in a range from about 250 angstroms to about 350 angstroms. In detail, the thickness G1 of the first conductive layer CD1 may be about 150 angstroms, the thickness G2 of the second conductive layer CD2 may be about 1500 angstroms, and the thickness G3 of the third conductive layer CD3 may be about 300 angstroms. However, the thicknesses G1, G2, and G3 of the first, second, and third conductive layers CD1, CD2, and CD3 should not be limited thereto or thereby.

Figure 16:
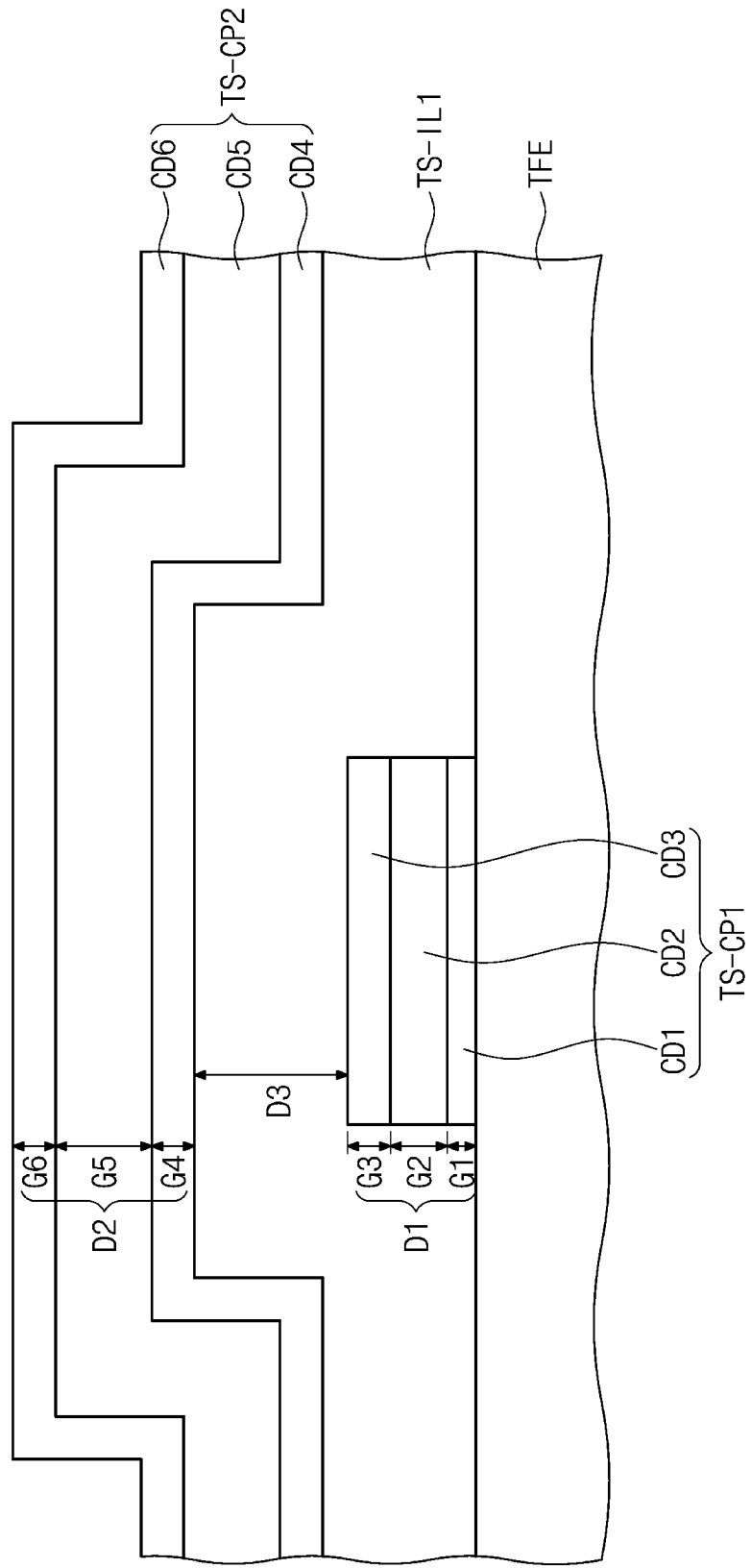
FIG. 16 is a cross-sectional view showing a touch sensing unit included in a display device according to an embodiment of the present disclosure.

FIG. 16 is a cross-sectional view showing a touch sensing unit included in a display device according to an embodiment of the present disclosure.

Referring to FIG. 16, the second conductive pattern TS-CP2 may have a multi-layer structure as similar to the first conductive pattern TS-CP1, but it should not be limited thereto or thereby. The second conductive pattern TS-CP2 may have a single-layer structure if the second conductive pattern TS-CP2 is thicker than the first conductive pattern TS-CP1.

The second conductive pattern TS-CP2 may have a triple-layer structure. The second conductive pattern TS-CP2 may include a fourth conductive layer CD4, a fifth conductive layer CD5, and a sixth conductive layer CD6. The fourth conductive layer CD4 is located on the first touch insulating layer TS-IL1, the fifth conductive layer CD5 is located on the fourth conductive layer CD4, and the sixth conductive layer CD6 is located on the fifth conductive layer CD5. In this case, the entire thickness D2 of the second conductive pattern TS-CP2 corresponds to a sum of a thickness G4 of the fourth conductive layer CD4, a thickness G5 of the fifth conductive layer CD5, and a thickness G6 of the sixth conductive layer CD6.

The fifth conductive layer CD5 has an electrical resistivity smaller than that of each of the fourth conductive layer CD4 and the sixth conductive layer CD6. That is, the fifth conductive layer CD5 has a superior electrical conductivity when compared to that of each of the fourth conductive layer CD4 and the sixth conductive layer CD6. Each of the fourth, fifth, and sixth conductive layers CD4, CD5, and CD6 may include typical materials as long as the fourth, fifth, and sixth conductive layers CD4, CD5, and CD6 satisfy the above-mentioned relation. For instance, each of the fourth, fifth, and sixth conductive layers CD4, CD5, and CD6 may include silver, copper, aluminum, titanium, molybdenum, or an alloy thereof. As another example, each of the fourth and sixth conductive layers CD4 and CD6 may include titanium (Ti), and the fifth conductive layer CD5 may include aluminum (Al).

The thickness G5 of the fifth conductive layer CD5 may be greater than the thickness G4 of the fourth conductive layer CD4 and the thickness G6 of the sixth conductive layer CD6. The thickness G5 of the fifth conductive layer CD5 may be, for example, four times greater than the thickness G4 of the fourth conductive layer CD4. The thickness G5 of the fifth conductive layer CD5 may be, for example, four times greater than the thickness G6 of the sixth conductive layer CD6.

The fifth conductive layer CD5 is an essential component for the second conductive pattern TS-CP2 to serve as a conductive pattern, and the fourth and sixth conductive layers CD4 and CD6 serve as a protective layer protecting the fifth conductive layer CD5 to obtain a process stability. In detail, the fourth conductive layer CD4 protects the fifth conductive layer CD5 from defects occurring under the second conductive pattern CP2, and the sixth conductive layer CD6 prevents the fifth conductive layer CD5 from being damaged during an etching process.

The thickness G2 of the second conductive layer CD2 may be smaller than the thickness G5 of the fifth conductive layer CD5. That is, the entire thickness of the first conductive pattern TS-CP1 may become smaller than the second conductive pattern TS-CP2 by allowing the thickness G2 of the second conductive layer CD2 to be smaller than the thickness G5 of the fifth conductive layer CD5.

The thickness G1 of the first conductive layer CD1 may be smaller than the thickness G4 of the fourth conductive layer CD4. That is, the entire thickness of the first conductive pattern TS-CP1 may become smaller than the second conductive pattern TS-CP2 by allowing the thickness G1 of the first conductive layer CD1 to be smaller than the thickness G4 of the fourth conductive layer CD4 that is a lower protective layer of the second conductive pattern TS-CP2.

For instance, the thickness G4 of the fourth conductive layer CD4 is in a range from about 250 angstroms to about 350 angstroms, the thickness G5 of the fifth conductive layer CD5 is in a range from about 2200 angstroms to about 2800 angstroms, and the thickness G6 of the sixth conductive layer CD6 is in a range from about 250 angstroms to about 350 angstroms. In detail, the thickness G4 of the fourth conductive layer CD4 may be about 300 angstroms, the thickness G5 of the fifth conductive layer CD5 may be about 2500 angstroms, and the thickness G6 of the sixth conductive layer CD6 may be about 300 angstroms. However, the thicknesses G4, G5, and G6 of the fourth, fifth, and sixth conductive layers CD4, CD5, and CD6 should not be limited thereto or thereby.

The display device DD according to the embodiments of the present disclosure may reduce the occurrence of the crack in the insulating layer, e.g., the first touch insulating layer TS-IL1, included in the touch sensing unit TS. Consequently, the display device DD according to the embodiments of the present disclosure may reduce an electrical short defect of the touch sensing unit TS.

Although the embodiments of the present invention have been described, it is understood that the present invention should not be limited to these embodiments, but various changes and modifications can be made by one ordinary skilled in the art within the spirit and scope of the present invention as defined by the claims and their functional equivalents.

What is claimed is:

1. A display device comprising:
   a display panel; and
   a touch sensing unit on the display panel, the touch sensing unit comprising:
      a first conductive pattern on the display panel;
      an insulating layer covering the first conductive pattern; and
      a second conductive pattern on the insulating layer, partially crossing the first conductive pattern, and comprising:
         first touch sensor parts;
         second touch sensor parts spaced from the first touch sensor parts; and
         first connection parts connecting respective ones of the first touch sensor parts,
      wherein the first conductive pattern comprises electrically conductive second connection parts connecting respective ones of the second touch sensor parts, and
      wherein the second conductive pattern has a thickness that is greater than a thickness of the second connection parts.

2. The display device of claim 1, wherein the first conductive pattern and the insulating layer are directly on a thin film encapsulation layer of the display panel, and
   wherein the insulating layer comprises:
      a first part on the first conductive pattern, and spaced from the thin film encapsulation layer;
      a second part contacting with the thin film encapsulation layer; and
      a third part connecting the first part and the second part.

3. The display device of claim 1, wherein the thickness of the first conductive pattern is less than a thickness of the insulating layer.

4. The display device of claim 1, wherein the thickness of the first conductive pattern is equal to or greater than about 1800 angstroms, and equal to or less than about 2100 angstroms, and
   wherein the thickness of the second conductive pattern is equal to or greater than about 2700 angstroms, and equal to or less than about 3500 angstroms.

5. The display device of claim 1, wherein the first conductive pattern comprises:
   a first conductive layer on the display panel;
   a second conductive layer on the first conductive layer; and
   a third conductive layer on the second conductive layer, the second conductive layer having an electrical resistivity that is less than an electrical resistivity of the first and third conductive layers, and having a thickness that is greater than a thickness of the first conductive layer and a thickness of the third conductive layer.

6. The display device of claim 5, wherein the thickness of the third conductive layer is greater than the thickness of the first conductive layer.

7. The display device of claim 6, wherein the thickness of the third conductive layer is within a range from about one and a half times to about three times the thickness of the first conductive layer.

8. The display device of claim 5, wherein the thickness of the first conductive layer is in a range from about 50 angstroms to about 200 angstroms,
   wherein the thickness of the second conductive layer is in a range from about 1000 angstroms to about 1800 angstroms, and
   wherein the thickness of the third conductive layer is in a range from about 250 angstroms to about 350 angstroms.

9. The display device of claim 5, wherein each of the first conductive layer and the third conductive layer comprises titanium (Ti), and
   wherein the second conductive layer comprises aluminum (Al).

10. A display device comprising:
    a display panel; and
    a touch sensing unit on the display panel, the touch sensing unit comprising:
       a first conductive pattern on the display panel;
       an insulating layer covering the first conductive pattern; and
       a second conductive pattern on the insulating layer, partially crossing the first conductive pattern, and having a thickness that is greater than a thickness of the first conductive pattern,
    wherein the first conductive pattern comprises:
       a first conductive layer on the display panel;
       a second conductive layer on the first conductive layer; and
       a third conductive layer on the second conductive layer, the second conductive layer having an electrical resistivity that is less than an electrical resistivity of the first and third conductive layers, and having a thickness that is greater than a thickness of the first conductive layer and a thickness of the third conductive layer, and
    wherein the second conductive pattern comprises:
       a fourth conductive layer on the insulating layer;
       a fifth conductive layer on the fourth conductive layer; and
       a sixth conductive layer on the fifth conductive layer, the fifth conductive layer having an electrical resistivity that is less than an electrical resistivity of the fourth and sixth conductive layers, and having a thickness that is greater than a thickness of the fourth conductive layer and a thickness of the sixth conductive layer.

11. The display device of claim 10, wherein the thickness of the second conductive layer is less than the thickness of the fifth conductive layer.

12. The display device of claim 10, wherein the thickness of the first conductive layer is less than the thickness of the fourth conductive layer.

13. The display device of claim 10, wherein the thickness of the fourth conductive layer is in a range from about 250 angstroms to about 350 angstroms,
    wherein the thickness of the fifth conductive layer is in a range from about 2200 angstroms to about 2800 angstroms, and
    wherein the thickness of the sixth conductive layer is in a range from about 250 angstroms to about 350 angstroms.

14. The display device of claim 10, wherein each of the fourth conductive layer and the sixth conductive layer comprises titanium (Ti), and
   wherein the fifth conductive layer comprises aluminum (Al).

15. The display device of claim 1, wherein the first conductive pattern comprises second connection parts connecting the second touch sensor parts, and crossing the first connection parts.

16. The display device of claim 1, wherein each of the first touch sensor parts and the second touch sensor parts comprise a plurality of mesh lines defining a plurality of mesh holes, and
   wherein the second connection parts cross the mesh lines of the first touch sensor parts and the mesh lines of the second touch sensor parts.

17. The display device of claim 16, wherein the second connection parts do not cross the first connection parts.

18. The display device of claim 1, wherein the insulating layer is provided with a contact hole defined therethrough, and
   wherein the second connection parts connect the second touch sensor parts through the contact hole.

19. The display device of claim 1, wherein the display panel comprises:
   a base layer;
   a circuit layer on the base layer;
   an organic light emitting device layer on the circuit layer; and
   a thin film encapsulation layer on the organic light emitting device layer.

* * * * *